(12) United States Patent
Whiteside

(10) Patent No.: US 10,361,715 B1
(45) Date of Patent: Jul. 23, 2019

(54) DECOMPRESSION CIRCUIT

(71) Applicant: Amazon Technologies, Inc., Seattle, WA (US)

(72) Inventor: Raymond Scott Whiteside, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/997,185

(22) Filed: Jun. 4, 2018

(51) Int. Cl.
*H03M 7/40* (2006.01)
*H03M 7/30* (2006.01)

(52) U.S. Cl.
CPC ........... *H03M 7/6005* (2013.01); *H03M 7/40* (2013.01)

(58) Field of Classification Search
CPC .... H03M 7/6005; H03M 7/40; H03M 7/4031; H03M 7/00; H03M 5/00
USPC ......................................... 341/50, 51, 58, 67
See application file for complete search history.

(56) References Cited

U.S. PATENT DOCUMENTS

| | | | | |
|---|---|---|---|---|
| 5,122,875 A * | 6/1992 | Raychaudhuri | ...... | H04N 5/4401 348/390.1 |
| 5,600,677 A * | 2/1997 | Citta | ...................... | H04L 1/0054 348/E5.108 |
| 5,603,012 A * | 2/1997 | Sotheran | ............... | G06F 9/3867 712/208 |
| 5,629,958 A * | 5/1997 | Willming | .............. | H04L 1/0054 348/E5.108 |
| 5,734,341 A * | 3/1998 | Walker | .................. | H04J 3/0605 341/58 |
| 5,784,631 A * | 7/1998 | Wise | ...................... | G06F 9/3867 382/246 |
| 6,487,690 B1 * | 11/2002 | Schuster | ............... | H04L 1/0057 714/752 |
| 6,697,435 B2 * | 2/2004 | Anderlind | ............... | H04L 1/004 375/253 |
| 8,903,000 B2 * | 12/2014 | Nishioka | ............. | H04L 25/4908 375/257 |
| 9,252,805 B1 * | 2/2016 | Abali | ...................... | H03M 7/40 |
| 2003/0210163 A1 * | 11/2003 | Yang | ...................... | H03M 7/40 341/67 |

(Continued)

OTHER PUBLICATIONS

Yu-Hsin Chen, et al., Eyeriss: An Energy-Efficient Reconfigurable Accelerator for Deep Convolutional Neural Networks, IEEE, International Solid-State Circuits Conference, 2016, 44 pages.

*Primary Examiner* — Jean B Jeanglaude
(74) *Attorney, Agent, or Firm* — Kilpatrick Townsend & Stockton LLP

(57) ABSTRACT

Provided are systems and methods, including an integrated circuit, for data decompression of data encoded using a fixed-length encoding technique. For a data set where some symbols appear more frequently than others, the frequent symbols can be encoded into a short encoded symbol, and the remaining symbols can be encoded into a long encoded symbol. A decompression circuit can include decoder circuits that, upon receiving a set of input bits, can determine whether the set of input bits include one long encoded symbol or one or more short encoded symbols. The decoder circuit can then decode the one long encoded symbol or the one or more short encoded symbol. The fixed length of the encoded symbols can enable the decompression circuit to output decoded symbols at a same rate at which the circuit receives encoded symbols.

21 Claims, 8 Drawing Sheets

(56) References Cited

U.S. PATENT DOCUMENTS

| | | | |
|---|---|---|---|
| 2004/0039903 A1* | 2/2004 | Wise | G06F 9/3867 |
| | | | 712/300 |
| 2011/0096858 A1* | 4/2011 | Klimer | H04B 7/0854 |
| | | | 375/267 |
| 2011/0302475 A1* | 12/2011 | Eisenhuth | G06F 11/1012 |
| | | | 714/763 |

* cited by examiner

DECOMPRESSION CIRCUIT

BACKGROUND

Data compression can be used to reduce the size of a set of data. Reducing the size of the data can reduce the amount of space needed to store the data. Reducing the size can also reduce the amount of time needed to transfer the data from one location to another. Data compression can include encoding data into a more compact representation. Hence, data compression can also be referred to as encoding.

Data compression techniques consider various requirements, including speed (e.g., how quickly data can be compressed) and size (e.g., how small the data can be compressed). In some cases, speed and compression size can conversely affect each other. For example, making the data as compact as possible may require time, thus, when speed is not a consideration, it may be possible to make the data as compact as possible. As another example, when the data needs to be compressed within a certain amount of time, then a data compression technique may not be able to achieve optimal compactness.

When implementing data decompression in an integrated circuit, ensuring that the data can be decompressed or decoded at a certain rate may be more important achieving a particular compression ratio.

BRIEF DESCRIPTION OF THE DRAWINGS

Various embodiments in accordance with the present disclosure will be described with reference to the drawings, in which.

DETAILED DESCRIPTION

Figure 1:
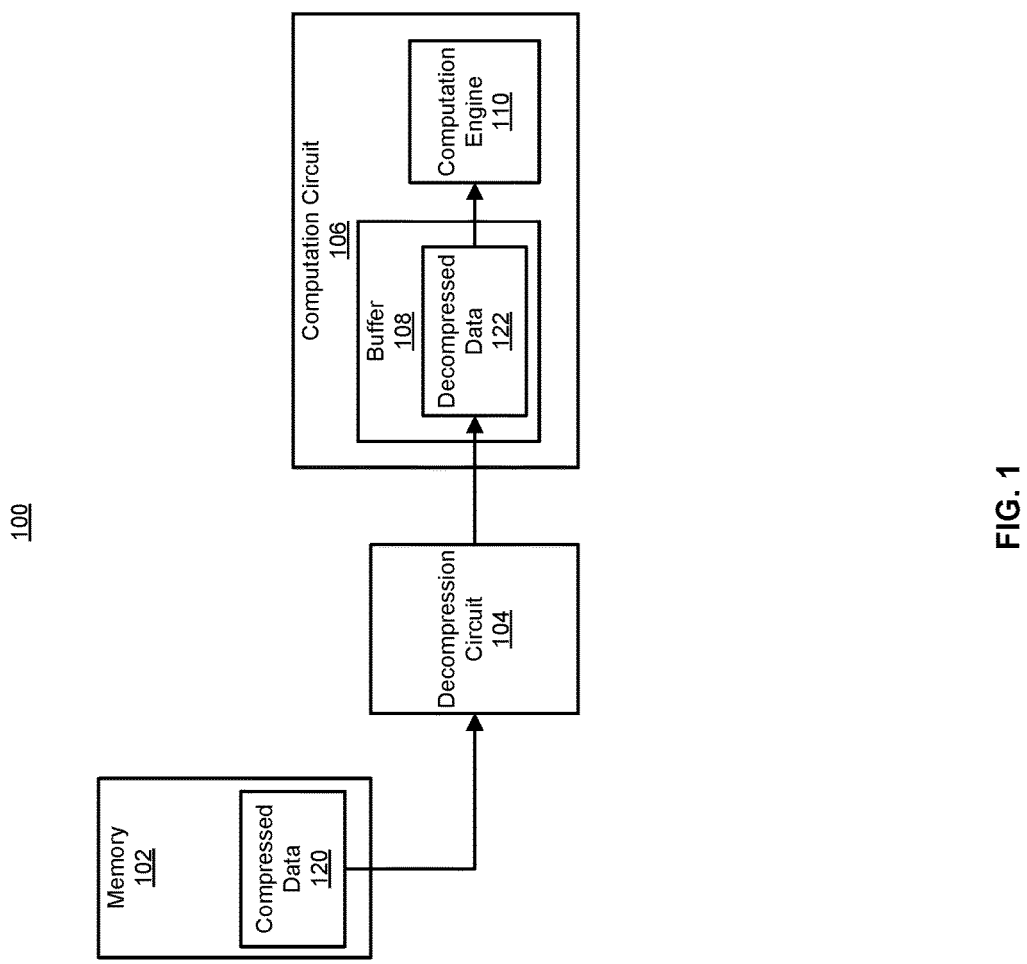
FIG. 1 includes a block diagram that illustrates an example of a system in which a decompression circuit can be used.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Data compression can be used to reduce the size of a set of data, which can be beneficial for reducing the amount of space needed to store the data and/or the amount of time needed to transfer the data.

Some data compression techniques take advantage of an uneven distribution in the frequency of symbols in a data set, where the uneven distribution can be used to achieve compression. A symbol, in this context, is a set of bits that is intended to convey some information. For example, the symbols "a," "b," and "c," convey three different characters of the alphabet. As another example, the symbol "128" can convey a color value between 0 and 255 for a pixel in a video image. Each symbol in a data set can be represented by a uniquely identifiable set of bits. Symbols are also referred to herein as characters, which can mean alphanumeric characters, punctuation symbols, and other characters. As an example, a data set can be described as having 256 unique characters or symbols, each of which can be represented using eight bits. An example of a symbol set containing 256 unique characters is the American Standard Code for Information Interchange (ASCII) character set.

In a data set, an uneven distribution can occur when some symbols appear less frequently than others. This uneven distribution can be used to compress the data in the data set. For example, assuming a data set having 256 unique symbols, instead of representing each symbol with eight bits, the most frequent symbols can be represented with the fewest number of possible bits and less frequent characters can be represented with eight or more bits. In this example, the number of bits used to encode each symbols may vary, and thus this technique can be referred to as a variable-length encoding.

Decoding a sequence of symbols that have been encoded using a variable-length encoding requires determining the starting point of each character. In various examples, this is accomplished by serially examining each bit in the sequence until a symbol is recognized. Once a symbol is recognized, the start of the next symbol is known.

In a hardware implementation, such as an integrated circuit implementing data decompression, serially decoding an encoded data sequence may not be very efficient, in terms of the speed at which the hardware can decode the data. For example, an integrated circuit may only be able to examine a certain number of bits per clock cycle, due to timing requirements or physical limitations on how many signals can be routed through the circuit, or for other reasons. While the circuit may be able, given enough time, to decode the sequence, the circuit may be under strict time constraints. For example, the circuit may be receiving encoded data at a certain rate, and, in order to not be a bottleneck in the data flow, should output decoded data at least at the same rate.

Hardware implementations can be efficient, in terms of how quickly the hardware can process data, because integrated circuits can be constructed to execute operations in parallel, as well as for other reasons. Parallelization enables a circuit to, for example, examine multiple sets of bits in the same clock cycle. In various examples, an integrated circuit can be built that can examine a parts of a variable-length encoded sequence in parallel, but such a circuit maybe excessively large and/or may require a large amount of wiring. Such a circuit may not meet area requirements on the chip, nor timing requirements that would enable the circuit to process data at a fast enough rate. The total size of the chip may be limited by the process technology used to produce the chip, and/or the need for the cost to produce the chip being below a threshold. The effort required to meet timing can also increase the cost of the chip beyond an amount that can support the production of the chip.

In various implementations, a hardware solution for data decompression can process data at a high rate of speed by using a fixed-length encoding technique. For example, for a data set where some symbols appear more frequently than others, symbols can be represented using a fixed number of bits, such as, for example, ten bits, instead of a range of numbers of bits. In this example, the most frequent symbols can be represented with fewer than ten bits, and all other symbols can be represented using the fixed length of ten bits. In some examples, a decoder circuit can examine, for example, ten bits at a time, where the ten bits represent one or more encoded characters. In various examples, the ten bits of this example can include one or more control bits that indicate whether the ten bits contain one encoded character or more than one. Use of the control bits can simplify the encoding scheme, and reduce the number of bits needed to represent all the symbols in the data set.

In various implementations, a decompression circuit can include multiple decoder circuits, where each decoder circuit can examine, in parallel, a certain number of bits from an encoded data sequence. Having multiple decoder circuits can enable the decompression circuit to process encoded data at least at the rate at which the decompression circuit receives the data. For example, if the decompression circuit receives 100 bits per clock cycle and each decoder circuit can examine ten bits at a time, then with ten decoder circuits the decompression circuit can process all 100 bits in the same clock cycle.

Compared to variable-length encoding techniques, fixed-length encoding techniques may result in a lower compression ratio. Compression ratio, in this context, means the size of the compressed data as compared to the size of the uncompressed data, such that a smaller value for the compression ratio indicates a greater degree of compression. Fixed-length encoding can enable fast decompression of encoded data when speed is a requirement. For certain data sets, fixed-length encoded can also achieve compression over the size of the data set when uncompressed, and thus can still be beneficial for reducing the amount of space needed to store the data and the amount of time needed to move the data.

FIG. 1 includes a block diagram illustrating an example of a system 100 in which a decompression circuit 104 can be used. In the example system 100, compressed data 120 is stored in a memory 102. The memory 102 can, for example, be processor memory, that is the memory, which is often volatile, used by a processor integrated circuit to store code that the processor is currently executing and/or values that the processor is currently operating on. Alternatively or additionally, the memory 102 can be non-volatile memory, such as flash memory or storage disk. The compressed data 120 may have been compressed to reduce the amount of space in the memory 102 needed to store the data. Alternatively or additionally, the compressed data 120 may have been compressed to reduce the amount of bandwidth (for example, in bytes per second) required to read the data from the memory 102. In some examples, the compressed data 120 can have been compressed by a software application. In some examples, the system 100 can include a circuit that can have produced the compressed data 120.

In the example system 100, a computation circuit 106 is illustrated as a circuit that may need the compressed data 120 to be decompressed, so that the computation circuit 106 can operate on the decompressed data 122. The computation circuit 106 may, for example, include a computation engine 110 that performs computations on the decompressed data 122 and makes determinations using the decompressed data 122. The computation circuit 106 is illustrated as one example of a circuit that may operate on the decompressed data 122. In other examples, other circuits, such as a processor, may operate on the decompressed data 122.

In various examples, to provide the decompressed data 122 to the computation circuit 106, the compressed data 120 can be input into the decompression circuit 104. The decompression circuit 104 can then output decoded or decompressed data 122 to the computation circuit 106. In some examples, the computation circuit 106 can include a buffer 108 that can temporarily store the decompressed data 122, and from which the computation engine 110 can read the decompressed data 122. Various examples of decompression circuits are discussed below.

One advantage of the compressed data 120 is that the compressed data 120 can take less time to transfer from the memory 102 to the buffer 108 of the computation circuit 106 than if the data were uncompressed. For example, a compression algorithm may be able to compress one gigabyte (GB) of data down to 850 megabytes (MB). In this example, when the bandwidth from the memory 102 is 64 bytes per clock, then 850 MB would take 13,281,250 clock cycles to transfer, where 1 GB would take 15,725,000 clock cycles to transfer. As illustrated by this example, a percentage reduction in the size of the data can have a corresponding percentage reduction in the amount of time needed to read the data.

Because the decompression circuit 104 is in the path between the memory 102 and the computation circuit 106, a requirement on the decompression circuit 104 can be that the decompression circuit 104 not add to the time needed for the computation circuit 106 to obtain the data. For example, when the decompression circuit 104 receives the compressed data 120 at a rate of 64 bytes per clock, the decompression circuit 104 should output decompressed data 122 at least at 64 bytes per clock. Alternatively, in the preceding example, when the decompression circuit 104 is not able to output the decompressed data at 64 bytes per clock, then the decompression circuit 104 should still output data fast enough that the time gained from compressing the data is not lost. For example, if the uncompressed data requires 15,725,000 clock cycles to transfer and the compressed data, assuming no delays, requires 13,281,250 clock cycles to transfer, then any delay added by the decompression circuit 104 should not add more than 2,343,750 clock cycles to the time required to transfer the compressed data. If the decompression circuit 104 takes too long, then the advantage of compressing the data is lost, and it may be more efficient to leave out the decompression circuit 104, and store the data in the memory 102 in an uncompressed format.

In some examples, however, reducing the size of the data may be important enough that delay caused by the decompression circuit 104 would be acceptable. For example, in some applications, the size of the memory used to store the data may need to be no more than a certain size.

Figure 2:
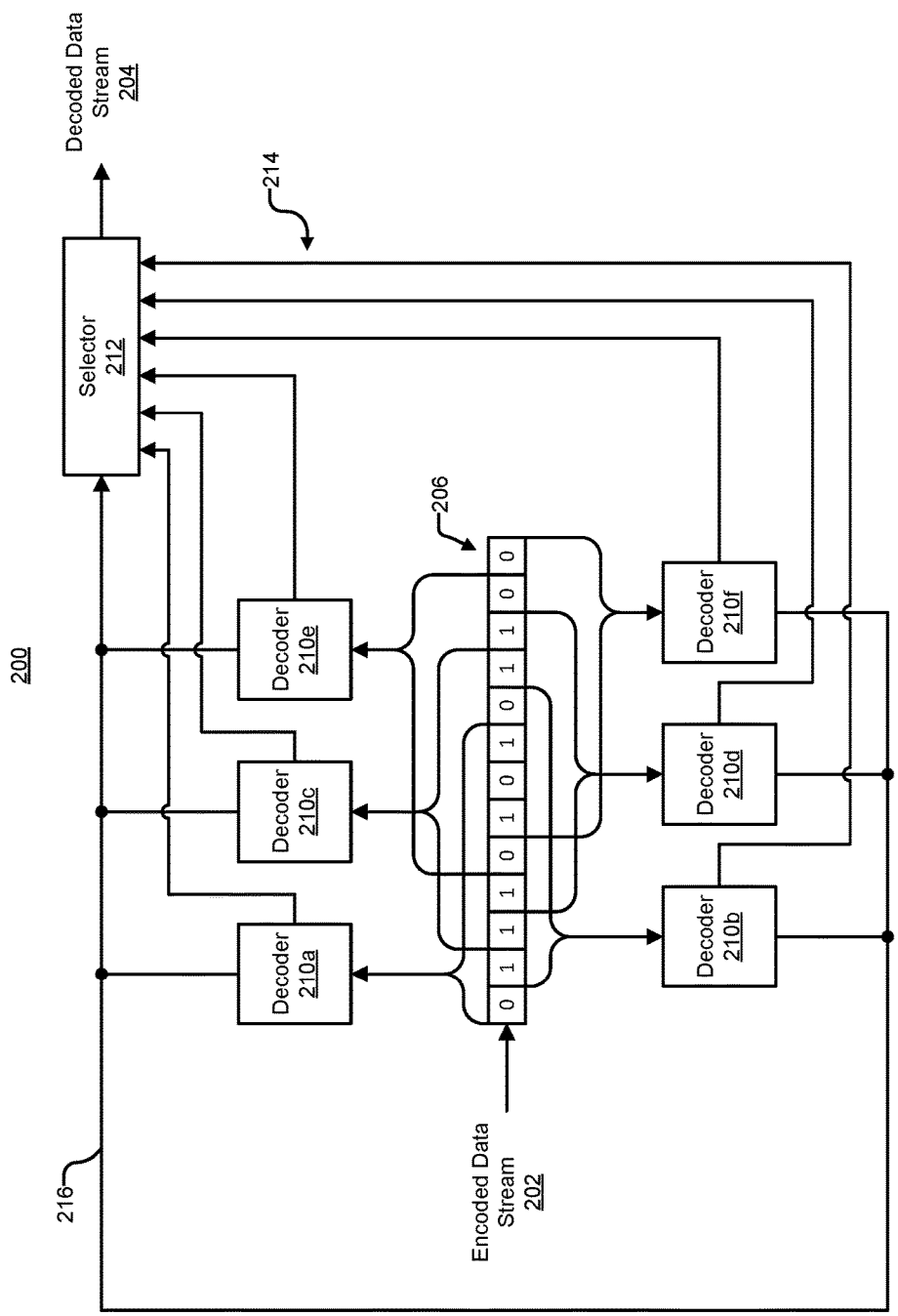
FIG. 2 includes a block diagram that illustrates an example of a decompression circuit.

FIG. 2 includes a block diagram illustrating an example of a decompression circuit 200. In this example, the decompression circuit 200 can decode an encoded data stream 202 that has been encoded using a variable-length encoding technique. The example decompression circuit 200 includes multiple decoder circuits 210a-210f for decoding the encoded data stream 202, and a selector circuit 212 for selecting valid decoded symbols to output into a decoded data stream 204.

In various examples, the decompression circuit 200 can receive a set of input bits 206 from the encoded data stream 202 at each clock cycle. In the illustrated example, the decompression circuit 200 receives thirteen bits in every clock cycle, for example at the rising edge or falling edge of a clock signal. In other examples, the decompression circuit 200 can receive more or fewer than thirteen bits in every clock cycle. In various examples, the set of input bits 206 received in each clock cycle can represent one symbol or multiple symbols, and the decompression circuit 200 may be required to output, in the next clock cycle (e.g., at the next clock edge), all the symbols represented by the bits. That is, the decompression circuit 200 may be required to output decoded symbols at the same rate at which the decompression circuit 200 receives encoded symbols. In the example of FIG. 2, the maximum length of any encoded symbol is 8 bits, and the set of input bits 206 from the encoded data stream 202 represent between one and six symbols.

As discussed further below, variable-length encoding techniques can result in each successive symbol in the encoded data stream 202 having a different length. For example, the set of input bits 206 can start with a three-bit-long symbol that is followed by a four-bit-long symbol, which is then followed by a two-bit-long symbol, and so on. For the decompression circuit 200 to determine the start of a symbol, the decompression circuit 200 thus first needs to decode the preceding symbol.

One approach the decompression circuit 200 can employ to decode symbols that vary in length is for a the decompression circuit 200 to shift sets of bits from the set of input bits 206 into a decoder circuit until the decoder circuit has been able to examine each bit from the set of input bits 206. For example, given a length of twelve bits for the maximum length of any symbol in the encoded data stream 202, the decoder circuit can examine the first twelve bits from the set of input bits 206 (e.g., bits 0 through 11), and decode each of the symbols that can be included in the first twelve bits. The first symbol may be only one bit long, thus, in this example, the decompression circuit 200 can shift the encoded data stream 202 by one bit, and have the decoder circuit examine the next twelve bits (e.g., bits 1 through 12). As further example, the next symbol may be four bits long, and having identified the symbol represented by these four bits, the decompression circuit 200 can add four more bits (e.g., bits 5 through 16) to the set of bits being examined by the decoder circuit.

A problem with the approach described above is that the decompression circuit 200 may not be able to output all the symbols contained in the set of input bits 206 in one clock cycle. For example, the decompression circuit 200 may require a clock edge each time the decompression circuit 200 inputs a subset of the set of input bits 206 into the decoder circuit. In this example, the decompression circuit 200 may use up to six clock cycles, or possibly more, to decode all thirteen bits in the set of input bits 206.

Another approach, which can result in the decompression circuit 200 being able to output all of symbols encoded in the set of input bits 206 in one clock cycle, is for the decompression circuit 200 to examine multiple subsets of the set of input bits 206 in parallel. This approach is illustrated in the example of FIG. 2. In this example, the decompression circuit 200 includes six decoder circuits 210a-210f, each receiving 8 bits from the set of input bits 206 in each clock cycle. The first decoder circuit 210a receives bits 0 through 7, the second decoder circuit 210b receives bits 1 through 8, the third decoder circuit 210c receives bits 2 through 9, the fourth decoder circuit receives bits 3 through 10, the fifth decoder circuit receives bits 4 through 11, and the sixth decoder circuit receives bits 5 through 12. In various examples, the decompression circuit 200 can include additional decoder circuits for each bit position in the set of input bits 206. IN these examples, the additional decoder circuits may examine fewer than 8 bits.

In this example, each of the decoder circuits 210a-210f can determine whether the 8 bits being examined by each respective decoder circuit includes a valid symbol. Output signals 214 from each of the decoder circuits 210a-210f can carry decoded symbols from each of the decoder circuits 210a-210f. to the selector circuit 212. In some examples, the decoder circuits 210a-210f assume that the bits being examined include an encoded symbol. In these examples, the decoder circuits 210a-210f may output a decoded symbol even when the bits do not, in fact, include a valid encoded symbol. For example, assuming that the longest possible symbol is eight bits long, the thirteen bits in the set of input bits 206 illustrated in FIG. 2 can include one eight-bit-long encoded symbol and five additional bits that belong to other symbols. In this example, one of the decoder circuits will receive the eight-bit-long symbol, while the remaining five decoder circuits may receive bits that do represent valid encoded symbols. In this example, the decoder circuits 210a-210f may include logic to determine whether or not to output an incorrectly decoded symbol, all zeros, all ones, to leave the values on the output signals 214 unchanged from the previous clock cycle, to perform another action, or to perform no action.

In some examples, the selector circuit 212 can determine whether or not to output a symbol from a decoder circuit to the decoded data stream 204. To determine whether the decoder circuits 210a-210f are outputting valid decoded symbols, the decoder circuits 210a-210f can output select signals 216 to the selector circuit 212. Using the select signals 216, the selector circuit 212 can determine whether the output from any of the decoder circuits 210a-210f should be included in the decoded data stream 204. In some examples, the select signals 216 can indicate the number of bits determined by each of the decoder circuit 210a-210f to include an encoded symbol. For example, the first decoder circuit 210a can have identified an encoded symbol in the first four bits being examined by the first decoder circuit 210a. In this example, the first decoder circuit 210a may examining the earliest bits in the set of input bits 206, in which case the selector circuit 212 can assume that the first decoder circuit 210a is outputting a valid decoded symbol, and can add this symbol to the decoded data stream 204. Also in this example, the selector circuit 212 can determine that neither the second decoder circuit 210b, the third decoder circuit 210c, or the fourth decoder circuit 210d are outputting a valid decoded symbol, because each of these decoder circuits are examining bits determined by the first decoder circuit 210a to be part of an encoded symbol. In this example, the selector circuit 212 can determine to ignore the outputs of the second, third, and fourth decoder circuits. The selector circuit 212 can further determine that the next valid decoded symbol is being output by the fifth decoder circuit 210e.

With six decoder circuits 210a-210f, the decompression circuit 200 may be able to examine all thirteen bits in the set of input bits 206 in one clock cycle. In some situations, however, the decompression circuit 200 may not be able to decode all thirteen bits. For example, continuing with the prior example, where the first encoded symbol is four bits long, the next encoded symbol may be six bits long. In this case, the fifth decoder circuit 210e can output a valid decoded symbol, but the sixth decoder circuit 210f cannot, and the remaining three bits in the set of input bits 206 may need to be held over for examining in the next clock cycle. In some examples, to reduce the need to hold bits over, and/or to decode the set of input bits 206 plus some held over bits, the decompression circuit 200 can include one or more additional decoder circuits that are active when needed. For example, in the example illustrated in FIG. 2, the decompression circuit 200 can include five additional decoder circuits that start at bit positions 8, 9, 10, 11, and 12 of the set of input bits 206, respectively. In this example, the additional decoder circuits can receive fewer than eight bits from the set of input bits, and possibly also one or more bits held over from the previous clock cycle (or zeros, or some other value when no held over bit are available). Furthermore, when, for example, the last five bits in the set of input bits 206 include an entire encoded symbol, then only one of the additional decoder circuits is needed, and the remaining four can remain idle or the output from these four can be ignored.

In some examples, bit locations at the end of the set of input bits 206 that cannot be decoded along with the data in bit locations at the beginning of the set of input bits 206 can be filled with zeros instead of bits from encoded symbols. In these examples, the compression rate (e.g., the size of the compressed data relative to the size of the uncompressed data) may be reduced, but the need to hold over bits to the next clock cycle can be eliminated.

In some examples, each of the decoder circuits 210a-210f can identify and decode more than one symbol from the bits being examined by each decoder circuit. For example, the set of input bits 206 may include a six-bit encoded symbol followed by a two-bit encoded symbol. In this example, neither the second decoder circuit 210b, third decoder circuit 210c, fourth decoder circuit 210d, fifth decoder circuit 210e, or sixth decoder circuit 210f may be able to output a valid decoded symbol, even though the set of input bits 206 includes more than one encoded symbol. In this example, the decoder circuits 210a-210f may be able to decode two symbols at a time, for example by having a dual-ported lookup table that can support to reads at the same time. Enabled the decoder circuits 210a-210f to decode two encoded symbols per clock cycles, fewer bits may need to be held over for examining in the next clock cycle.

In some examples, an additional technique for managing bits being held over from one clock cycle to the next, or to otherwise aid in reducing any delay that may be caused by the decompression circuit 200 is to have the decompression circuit 200 operate faster than the rate at which encoded data is received. For example, the decompression circuit 200 may be able to operate at twice the input clock frequency by using clock signal that is running twice as fast as the clock used to input the data. In this example, some or all of the decoder circuits 210a-210f may be idle in some clock cycles, but the decompression circuit 200 would be able to output decoded symbols at least as fast as encoded symbols are received.

The decompression circuit 200 illustrated in FIG. 2 can implement decoding for various types of variable-length encoding techniques. Huffman encoding is one such technique. Huffman encoding uses an uneven distribution of symbol frequencies in a data set to compress the data. For example, for a data set including books published in the United States from 1900 to 1999, when the appearance of letters, numbers, and symbols in these texts are counted, some characters may appear very frequently, while others appear less frequently or infrequently. In this example, the unencoded characters can be represented using eight bits per symbol. With a Huffman encoding, the most frequent characters of this example can be represented with fewer than eight bits, and less frequent characters can be represented with eight or more bits. A Huffman encoding can result in the savings, in terms of the compressed data size, from the more frequent symbols more than making up for the gain, in data size, produced by the less frequent symbols.

An example of a Huffman encoding is as follows: for a particular data set, the three most frequent symbols may be the space character, "a," and "e." In this example, these three characters can be represented using three bits, such as "111," "010,", and "000," respectively. The next seven most frequent characters may be "f," "h," "i," "m," "s," and "t." These can be represented using four bits, such as "1101," "1010," "500," "0111," "0010," "1011," and "0110," respectively. The next eight most frequent characters can be represented with five bits, and so on. Because the length successive symbols in an encoded data stream varies, Huffman encoding can also be referred to as Variable Huffman Encoding.

For the decompression circuit 200 illustrated in FIG. 2 to decode an encoded data stream 202 that has been encoded using a Huffman encoding, each of the decoder circuits 210a-210f can include a lookup table that provides a mapping from encoded symbols to decoded symbols. In various examples, the lookup table includes an entry for each symbol in the data set (e.g., if the data set has 256 symbols, the lookup table have 256 entries). In some examples, the decompression circuit 200 may receive different data streams encoded with different mappings, such that the decoder circuits 210a-210f may need multiple lookup tables, one for each mapping supported by the decompression circuit 200. In some examples, instead of having multiple lookup tables in each of the decoder circuits 210a-210f, the decompression circuit 200 can include multiple sets of decoder circuits, each set can be programmed with a different mapping. In this example, different sets of the decoder circuits can be activate when data mapped with different encodings is received. In some examples, to decode data mapped with different mappings, the lookup tables in the decoder circuits 210a-210f can be reprogrammed with the appropriate mapping.

Lookup tables, which can be implemented using memories such as content-addressable memories (CAMs), require a certain amount of area on a chip. When a decoder circuit includes more than one lookup table, and a decompression circuit has many decoder circuits, the overall area of the decompression circuit may become quite large. Additionally, because a decoder circuit may be needed for every bit position in the set of input bits 206, the area needs may increase when the amount of data received per cycle increases. For example, when the number of bits received in each clock cycle is 32 bits, a decompression circuit may need 30 to 32 decoder circuits. Because wires also require space on a chip, wiring the select signals 216 from the decoder circuits 210a-210f to the selector circuit 212 may also require a large amount of chip area. With a large number of decoders, these wires may also become so long that the amount of time required for a signal to propagate down the wire may be longer than a clock cycle.

Having so many decoder circuits can also increase the complexity of the selector circuit 212. For example, in the example illustrated in FIG. 2, each of the output signals 214 can be, for example, eight bits wide. As a further example, the select signals 216 can be one bit wide (e.g., indicating valid or not valid), or can be wider to indicate a number of bits found to include a valid encoded symbol. With more decoder circuits, the selector circuit 212 may thus need to support a large number of input ports, more so than may be possible for a given manufacturing technology.

The selector circuit 212 may also need to determine, in a linear fashion, which of the decoder circuits 210a-210f are outputting a valid decoded symbol. For example, whether the second decoder circuit 210b is outputting a valid decoded symbol is not known until the selector circuit 212 determines whether the first decoder circuit 210a is outputting a valid decoded symbol, and whether the third decoder circuit 210c is outputting a valid decoded symbol is not known until the selector circuit 212 determines whether the second decoder circuit 210b is outputting a valid decoded symbol, and so on. The requirement that each decoder circuit consider the outputs of all preceding decoder circuits can result in the decision making circuit for each successive decoder circuit being more and more complex. The complexity of the decision making process can result in the selector circuit 212 not being able to perform all operations within one clock cycle.

An alternative that can reduce the complexity of the selector circuit 212 is for each decoder circuit to send an invalidate signal to successive decoder circuits. For example, when the first decoder circuit 210a has found a four-bit long encoded symbol, the first decoder circuit 210a can send invalidate signals to the second decoder circuit 210b, third decoder circuit 210c, and fourth decoder circuit 210d to indicate to these decoder circuits that these decoder circuits are not starting with an encoded symbol. Also in this example, the first decoder circuit 210a can include invalidate signals to the fifth decoder circuit 210e and the sixth decoder circuit 210f, and can use these signals to indicate that these decoder circuits may be starting with valid encoded symbols.

Some possible difficulties with the use of invalidate signals as described above include routing complexity and propagation delay. Wires for carrying the invalidate signals need to be placed on the chip, and short, straight paths between a decoder circuit and successive decoder circuits may be difficult to find. Additionally, as the number of decoder circuits increase, the wires may become very long, such that the time required for a signal to propagate down the length of the wire may exceed one clock cycle.

In some examples, the number of decode circuits in the decompression circuit 200 can be reduced by limiting the number of possible bit lengths used in an encoding. For example, instead of allowing symbols to be one, two, three, four, or some other number of bits long, the number of bits used to encode the symbols can be limited to three or six bits. In this example, the amount of compression that can be achieved may be less, but the number of decode circuits needed in the decompression circuit can be reduced. For example, if only three or six bits are used to encode the symbols in a data set, the decompression circuit can include decoder circuit for every three bit positions instead of every bit position.

In some examples, interdependency between the decoder circuits can also be reduced. For example, encoding of the symbols in the data set can include a block length, such that new symbols start only at certain intervals. For example, a block length of sixteen means that, if the bits for a symbol cannot fit within the current sixteen bits, the symbol will go into the next sixteen bits. In this example, any bits in the block of sixteen that are not occupied can be filled with zeros. Use of a block length can reduce the amount of compression that can be achieved, but the block length would provide starting points for decoding symbols, such that a decompression circuit can group decoder circuits into sets for each block. Within a set, the decoder circuits can include invalidate signals to successive decoder circuits in the set, but the decoder circuits in one set need not provide invalidate signals to decoder circuits in another set. Alternatively, a selector circuit need only make decisions about the outputs of a set of decoder circuits, instead of across all decoder circuits. Use of a block length can thus reduce wiring and timing issues. In various examples, a smaller block length can result in a block being faster to decode, however, smaller block lengths may result in an increase in zero padding, which would reduce compression performance.

In various examples, another approach for making decoding of a Huffman encoding feasible in hardware is to is to loosen the requirement that a decompression circuit output decoded symbols at least at the same rate that the circuit receives encoded symbols, and does so all the time. A less strict requirement can be made possible by the uneven frequency distribution of the characters in a data set. For example, the set of bits received by a decompression circuit in each clock cycle may be forty bits long, and the maximum symbol length may be twenty bits long. For this example, the decompression circuit can have forty decoder circuits, one for every bit position in the set of input data. In this example, the most time consuming operation for the decompression circuit is when the set of input data includes two maximum length symbols. Decoding two maximum length symbols can require the most time because each decoder circuit would have to send the most possible invalidate signals to successive decoder circuits, resulting in the longest wires being used. Two maximum length symbols in the input data, however, should be a rare occurrence, given that only the most infrequent characters would be encoded into twenty bits. The decompression circuit can have many fewer decoder circuits when the decompression circuit is configured to handle the most common scenarios, rather than the worst case scenario. For example, and continuing with the previous example, most symbols may be encoded with eight or fewer bits. In this example, the decompression circuit can have, for example, a decoder circuit for every eight bits, or five decoder circuits for a forty-bit long set of input data. In this example, for most of the time the decompression circuit will output all the decoded symbols included in a set of input bits, and on the infrequent occasions that the set of input lengths includes infrequent symbols the decompression circuit may need multiple clock cycles to output all the symbols.

In some examples, Huffman encoding has been shown to achieve a 61% compression rate for certain data sets.

Other encoding techniques can avoid use of lookup tables. For example, an encoding technique can use addition instead of a lookup table. Addition can be performed using an adder circuit, which can require less chip area than a lookup table. Additionally, the same adder circuit can be used when different data streams are encoded with different baselines. One example of an additive coding technique uses the most frequent symbol as a median or mode, and thus can be referred to as Variable Mode Addition.

Encoding techniques that use addition can be effective when the frequency distribution of the symbols in a data set is concentrated around a set of consecutive symbols. For example, for a data set including digital images, the symbols in the data set can be pixel values between 0 and 255. In this example, the frequency of the occurrence of each pixel value from 0 to 255 can be graphed, and the graph may show that the most frequent symbols are between symbol values 40 and 60. In this example, the symbol with value 50 can be used as a baseline for encoding, with a small number of bits, a range of symbols having values greater than or less than 50 (encompassing the most frequent symbols), with symbols outside the range being encoded with a greater number of bits. For example, for a data set having 256 unique symbols, the symbols within the range can be encoded using fewer than eight bits, while the symbols outside the range can be encoded with eight bits (e.g., the same bits these symbols would have when not encoded). Upon receiving a data stream encoded in this manner, a decoder can, first, determine whether a symbol in the data stream is a short symbol or a long symbol, and when the symbol is a short symbol, can add the value of the mode symbol (e.g., 50) to the value encoded in the short symbol.

For some data sets, the range covering the most frequent symbols (e.g., 40 to 60 in the preceding example) can also include symbols that are infrequent (e.g., symbol 51, 53, and 55 may be infrequent symbols). In these examples, the infrequent symbols within the range can also be encoded into short symbols, and less compression may be achievable for these data sets.

As an example of an additive coding technique, the symbols in a data set that has 256 symbols can be represented using eight bit values. In an encoded data stream, the most frequent symbols can be represented using four bits, such that the sixteen symbols around the mode symbol (e.g., seven symbols greater than the mode, eight symbols less than the mode symbol, and the mode symbol itself) can be encoded into four bits. For example, assuming the mode symbol's literal or unecoded value is 50, then symbols 51 through 57 can be represented with encoded values representing +1 through +7, respectively, and symbols 42 through 49 can be represented with encoded values −8 through −1, respectively. For example bit values "0001", "0010," "0011," "0100", "0101", "0110," and "0111" can represent +1 through +7, such that the mode symbol plus the bit value provides a decoded symbol. As a further example, bit values "1000", "1001," "1010," "1011,", "1100," "1101," "1110," and "1111," can represent −1 through −8, with the leftmost bit indicating that the remaining three bits represent a negative value minus one, such that the mode symbol minus the value of the right three bits minus one provides the decoded symbol. In other examples, other combinations of four bits can be used to represent +1 through +7 and −1 through −8.

In the preceding example, a control bit can be appended (or prepended) to each symbol to indicate whether the symbol is short symbol or a long symbol. Long symbols can then be nine bits long, while short symbols are five bits long. The additive coding technique of the preceding example can thus be referred to as a 5-bit compressed, 9-bit uncompressed scheme.

As a further example, to enable the encoding of more than sixteen symbols, an additional control bit can be appended (or prepended) to each symbol to indicate that a symbol represents a symbol another sixteen symbols beyond the first sixteen. For example, the control bit "0" can indicate that the next four bits represent an encoded symbol that is within +7 or −8 from the mode symbol. That is, the four bits represent a value that can be added to or subtracted from the mode symbol. In this example, the control bits "10" can indicate that the next four bits represent an encoded symbol that is either +8 to +14 from the mode symbol, or −9 to −16. That is, the four bits represent a value that, when added to or subtracted from +8 or −9, respectively, and then added to the mode symbol will give a decoded symbol. Also in this example, the control bits "11" can indicate that the next eight bits represent a long symbol. In this example, long symbols can be ten bits long, while short symbols are either five bits or six bits long. The compression scheme of this example can thus be referred to as a 5/6-bit compressed, 10-bit uncompressed scheme.

In various examples, the number of symbols that are encoded can be further increased using the technique described in the previous example. In some examples, increasing the number short symbols versus the number of long symbols can further increase the compression rate. For example, for some data sets, the 5-bit compressed, 9-bit uncompressed scheme resulted in a 62.7% best compression rate, a 100.2% worst compression rate (e.g., the compressed data size was larger), and an average compression rate of 79.6%. As another example, a 5/6-bit compressed, 10-bit uncompressed scheme resulted in a 62.5% best compression rate, a 98.9% worst compression rate, and a 73.1% average compression rate. As a further example, a 5/6/7-bit compressed, 11-bit uncompressed scheme resulted in a 62.6% best compression rate, 98.3% worst compression rate, and a 71% average compression rate. As a further example, a 5/6/7/8-bit compressed, 12-bit uncompressed scheme resulted in a 62.6% best compression rate, a 98.1% worse compression rate, and a 70.3% average compression rate.

A decompression circuit that implements an additive coding technique can require less area than a decompression circuit that implements a Huffman encoding technique. For example, in the example of FIG. 2, instead of having lookup tables, each of the decoder circuits 210a-210f can have an adder circuit, which can require much less area than a lookup table. Additionally, each of the decoder circuits 210a-210f could use one adder circuit for different mappings (e.g., mappings centered around different mode symbols).

As illustrated by the example compression rates noted above, an additive coding technique may be able to achieve better compression when more of the frequent symbols are encoded. Encoding more of the frequent symbols can result in the encoded symbols having more variations in bit lengths (e.g., a data set encoded with the 5/6/7/8-bit compressed, 12-bit uncompressed scheme can have five different bit lengths). A decompression circuit that implements an additive coding technique can thus encounter similar challenges as when the decompression circuit implements a Huffman encoding technique. For example, the decompression circuit may not be able the start of a symbol until the previous symbol has been decoded. A decompression circuit using an additive coding technique may thus be similar to the decompression circuit 200 of FIG. 2, and include a decoder circuit for most or every bit position in the set of input bits 206. Having many decoder circuits can also mean that the decompression circuit 200 may have wiring and propagation delay issues as were discussed above.

An approach that can reduce the number of decoder circuits in a decompression circuit is to use a fixed length when encoding the symbols in a data set. Fixed length, in this context, means that the symbols are all encoded into a same number of bits, and cannot be more than this number of bits. Using a fixed length can mean that the compression rate may not be as good, but the fixed length can enable a decompression circuit to be implemented with fewer decoder circuits and less complexity. Reducing the number of decoder circuits and the complexity of the overall circuit can enable the decompression circuit to more easily meet timing and area requirements.

Figure 3:
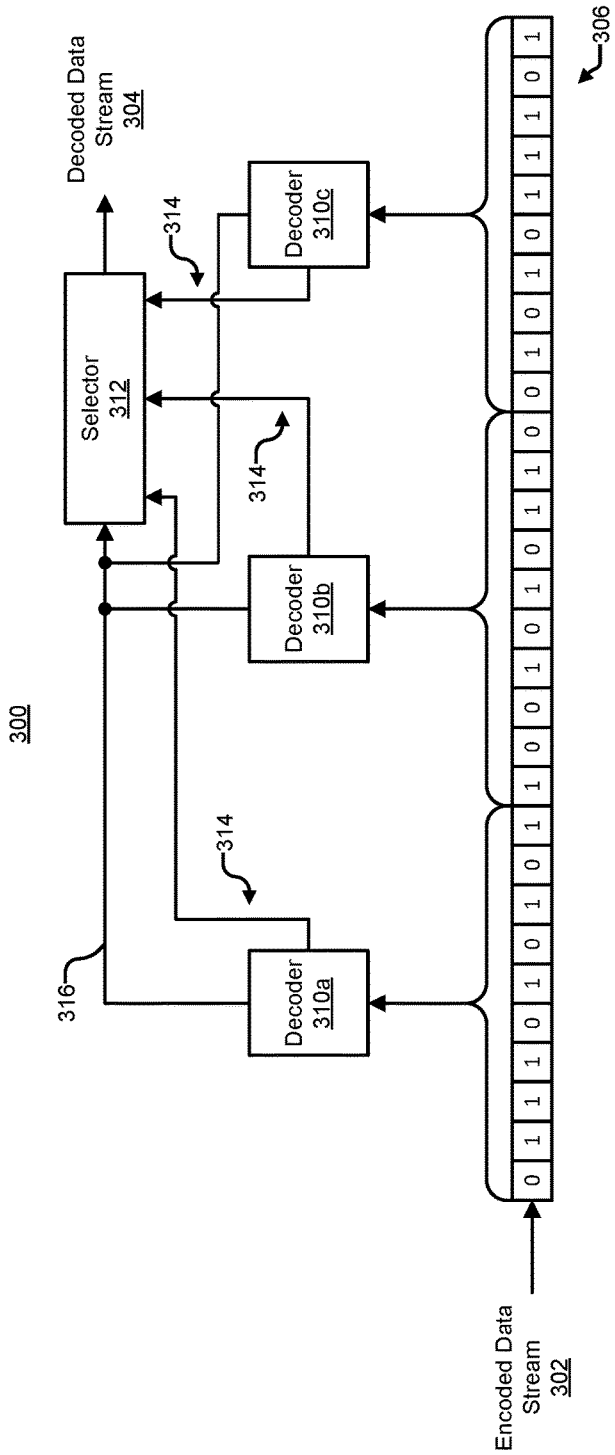
FIG. 3 includes a block diagram that illustrates an example of a decompression circuit.

FIG. 3 includes a block diagram illustrating an example of a decompression circuit 300 that can decode an encoded data stream 302 that has been encoded using a fixed-length encoding technique. The example decompression circuit 300 includes decoder circuits 310a-301c for decoding the encoded data stream 302 and a selector circuit 312 for selecting decoded symbols to output to a decoded data stream 304.

In various examples, the encoded data stream 302 can be received by the decompression circuit 300 as a set of input bits 306 that arrives on each clock cycle. In the illustrated example, the set of input bits 306 is thirty bits long. In other examples, the set of input bits 306 can include fewer bits or more bits. In various examples, the set of input bits 306 can include one encoded symbol or multiple encoded symbols. In the example illustrated in FIG. 3, short symbols (e.g., the more frequent symbols) are encoded with five bits and long symbols (e.g., the less frequent symbols) are encoded with ten bits, thus the set of input bits 306 an include between three and six symbols.

To decode the set of input bits 306, the example decompression circuit 300 includes three decoder circuits 310a-310c, a first decoder circuit 310a for the first ten bits in the set of input bits 306, a second decoder circuit 310b for the next ten bits, and a third decoder circuit 310c for the last ten bits. Each of the decoder circuits 310a-310c receives ten bits, in this example, because the encoded symbols in the set of input bits 306 are always contained within a set of ten bits. Because of the fixed length of ten bits, the decoder circuits 310a-310c need not examine overlapping bits. Instead, each of the decoder circuits 310a-310c can independently decode a subset of the set of input bits 306. Additionally, because each of the decoder circuits 310a-310c receive bits that start at a symbol boundary, the decompression circuit 300 no longer needs to determine whether the decoder circuits 310a-310c are each able to output a valid decoded symbol in any given clock cycle, and can instead assume that the decoder circuits 310a-310c can always output at least one valid decoded symbol (assuming that all the bits in the set of input bits 306 are all valid). Thus, the decoder circuits 310a-310c may not need to send a valid signal to the selector circuit 312.

Invalidate signals between the decoder circuits 310a-310c would also not be needed. As discussed above the first decoder circuit 310a, for example, would need to send an invalidate signal to the second decoder circuit 310b when the first decoder circuit 310a and the second decoder circuit 310b are examining overlapping bits, and a determination by the first decoder circuit 310a that the first decoder circuit 310a has found a valid encoded symbol can indicate that the second decoder circuit 310b may not be looking at a valid encoded symbol. In the example of FIG. 3, however, the decoding operation of the second decoder circuit 310b does not depend on the decoding operation of the first decoder circuit 310a. Thus, each of the decoder circuits 310a-310c does not need to send invalidate signals to successive the decoder circuits 310a-310c.

In other examples, other bit lengths can be used for the short and the long symbols. For example, the short symbols can be encoded with four, five, or six bits and the long symbols with fifteen bits, in which case each of the decoder circuits 310a-310f can receive fifteen bits and decode either one, two, or three symbols per clock cycle.

In the example of FIG. 3, in each clock cycle, the decoder circuits 310a-310c can each output either one or two decoded symbols (because the short encoded symbols are five bits long) on output signals 314 to the selector circuit 312. As noted above, the decoder circuits 310a-310c may not need to indicate to the selector circuit 312 whether the data on the output signals 314 is valid. Instead, in some implementations, the decoder circuits 310a-310c can use select signals 316 to indicate to the selector circuit 312 whether the output signals 314 includes one decoded symbols or two. In this illustrated example, the selector circuit 312 also does not need to make any decisions between the outputs of the decoder circuits 310a-310c, since the outputs of any one decoder circuit is not dependent on the results from other decoder circuits. The operation of the selector circuit 312 can thus be very simple, and the selector circuit 312 may only need to copy symbols from the output signals 314 for outputting into the decoded data stream 304. Additionally, complexity of the selector circuit 312 is also reduced due to having to consider the output of fewer decoder circuits.

In the examples described with respect to FIG. 2, in some cases, the last bits in a set of input bits can include only part of an encoded symbol, or may be filled with zeros or some other value to avoid having partial symbols. In the example of FIG. 3, having partial symbols or zero padding at the end of the set of input bits 306 can be avoided when the set of input bits 306 is a multiple of the fixed length into which the symbols are encoded. When the length of the set of input bits 306 is not a multiple of the fixed length, then, in some examples, the decompression circuit 300 can include an additional decoder circuit for processing the additional bits, and/or the additional bits can be held over to the next clock cycle. In some examples, the decompression circuit 300 can be clocked at twice the rate at which input data is received, so that the decompression circuit 300 can output all the symbols encoded in the set of input bits 306. Doubling the clock frequency of the decompression circuit 300 of FIG. 3 can be easier because the number of operations the decompression circuit 300 performs in one clock cycle is fewer, and the wire lengths may be shorter Area requirements for the decompression circuit 300 can also be less than in previous examples. The decompression circuit 300 of FIG. 3 can use far fewer decoder circuits than the previous examples. Additionally, the decompression circuit 300 can have fewer signals to wire between the decoder circuits 310a-310c and the selector circuit 312.

In various examples, the decompression circuit 300 can implement a Huffman encoding modified to use a fixed instead of variable length for the encoded symbols. As with the Huffman encoding described above, in various examples, the most frequent symbols can be encoded using uniquely identifiable combinations of bits. Instead of using the fewest possible bits, however, the sixteen (for example) most frequent symbols can be represented using four bits. Assuming a data set that has 256 symbols, all other symbols can encoded using eight bits, for example, the same eight bits used to represent the unencoded version of the symbols.

Continuing with the previous example, to identify whether a symbol is short or a long encoded symbol, two control bits can be added to the start or end of a set of eight bits. The two control bits can indicate whether: the next eight bits include a long encoded symbol; the next eight bits include two short encoded symbols, or the next eight bits include one short encoded symbol and four bits of padding. The third of the preceding situations covers the case where a frequent symbol is followed by an infrequent symbol. In this case, the frequent symbol occupies four bits and the remaining four bits in the set of eight can be filled with zeros or another value, or can be ignored by a decoder circuit. In this case, the frequent symbol results in a compression loss (e.g., the symbol occupies as much space in the encoded data as when the symbol is not encoded, plus the number of control bits). This encoding technique may thus be best used when data set includes frequent symbols that often occur together, such that incidents of a frequent symbol not being followed by another frequent symbol occurs rarely enough to affect the overall compression rate.

In various examples, the Huffman encoding technique of the previous example can be extended so that more than the first sixteen most frequent symbols can be encoded. For example, frequent symbols can be encoded with two sets of four bit encodings. In this example, the first set of encodings can map to the first sixteen most frequent symbols, and the second set of encodings can map to the second sixteen most frequent symbols. The remaining symbols can be encoded using eight bits. In this example, to distinguish among the different encodings, each set of eight bits can include two control bits indicating the contents of the eight bits. The two control bits can indicate whether: the eight bits are a long encoded symbol; the first four bits include a short encoded symbol from the sixteen most frequent symbols and the second four bits do not include an encoded symbol; the first four bits include a short encoded symbol from the sixteen most frequent symbols and the second four bits include also include a short encoded symbol from the sixteen most frequent symbols; or the first four bits include a short encoded symbol from the sixteen most frequent symbols and the second four bits include a short encoded symbol from the second sixteen most frequent symbols. In this example, when a symbol from the second sixteen most frequent does not follow a symbol from the first sixteen most frequent symbols, the symbol can be encoded as a long encoded symbol (e.g., using the eight bits that represent the symbol when the symbol is unencoded).

In the preceding example, the compression rate that can be achieved may rely on the data set having a relatively small number of symbols. Additionally, in both the preceding examples, it is assumed compression can be achieved because frequent symbols will be followed by frequent symbols.

In various examples, other bit lengths can be used. For example, nine bits can be set as the fixed length, in which up to three three-bit short symbols or one long symbol can be encoded. As another example, twelve bits can be used as the fixed length, containing three-bit-long, four-bit-long, or five-bit-long short symbols or one long symbol can be encoded. These example may be applicable when a data set includes fewer frequent symbols (e.g., 10% of the symbols in the data set represent 35% of the symbols in the data set, as opposed to 15% of the symbols in the data set representing 50% of the symbols in the data set). These examples can also achieve better rates of compression when runs of consecutive frequent symbols occurs often.

In some examples, the occurrence of padding or non-symbols in the encoded data stream 302 may be reduced by increasing the number of bits each of the decoder circuits 310a-310c examine, without changing the number of bits used to encode the symbols. For example, the decoder circuits 310a-310c can be provided with nineteen bits, three control bits plus sixteen data bits. In this example, the sixteen data bits can include two long encoded symbols, a long encoded symbol and two short encoded symbols, or four short encoded symbols. Instances of padding the sixteen data bits may still occur, such as when a long symbol is followed by two short symbols. As in the above examples, whether sufficient compression can obtained using this scheme may depend on the data set to which the scheme is applied.

To implement a fixed-length Huffman encoding technique, each of the decoder circuits 310a-310e in the decompression circuit 300 of FIG. 3 can include a lookup table. Though lookup tables require chip area, because the decompression circuit 300 uses far fewer decoder circuits, the overall area required by the decompression circuit 300 will be significantly less than for a variable-length Huffman implementation. Additionally, in some examples, the lookup table need only include mappings for the short encoded symbols, because the long encoded symbols can be represented using the same bits use to represent the equivalent decoded symbol. The lookup table can thus be much smaller than when both short and long encoded symbols need to be mapped. For example, for a data set having 256 unique symbols, when the short encoded symbols are four bits long, the lookup table only needs to map sixteen values instead of all 256.

In some examples, the performance of the ten-bit fixed length Huffman scheme discussed above achieved a 76% average compression rate for some data sets.

The decompression circuit 300 can, alternatively or additionally, implement an additive coding technique. To implement an additive coding technique, the decoder circuits 310a-310f can include adder circuits, which can require less chip area than lookup tables.

As discussed above, additive coding techniques can be applied when the most frequent symbols in a data set are clustered around a set of sequential symbols. In various examples, an encoding of the data set can be accomplished by identifying the symbol around which the sequential symbols are centered (referred to herein as the mode symbol). The symbols within a range of this symbol can then be encoded into short symbols, and symbols outside of this range can encoded as long symbols, for example using the unecoded values for this symbols.

In the example of FIG. 3, seven symbols greater than the mode symbol and eight symbols less than the mode symbol can be encoded into four bits, where the four bits represent an offset from the mode symbol. That is, the value represented by the four bits can be added to or subtracted from the mode symbol to produce the decoded symbol. All other symbols can be encoded as long symbols, using, for example, the eight bits for unecoded version of the symbols. In this example, a set of eight bits can thus include two short encoded symbols or one long encoded symbol. Two control bits can be added to each set of eight bits, to indicate what the eight bits contain. For example, the two control bits can indicate whether: the eight bits include a long symbol; the eight bits include two short symbols, or the eight bits include one short symbol and four bits of padding.

To encode more than the first sixteen most frequent symbols, in various examples, the next sixteen most frequent symbols can also be encoded using four bits. In these examples, the four bits for the second most frequent sixteen symbols can indicate an offset-plus-eight from the mode symbol. That is, the value represented by the four bits, plus eight or minus eight, depending on the sign of the value, can be added to or subtracted from the mode symbol. In these examples, a set of eight bits can include a long symbol or a combination of symbols from the sixteen most frequent symbols and/or the second sixteen most frequent symbols. Two control bits can be appended or prepended to each set of eight bits to indicate what the eight bits contain. For example, the two control bits can indicate whether: the eight bits include one long symbol; the first four bits include short symbol from the sixteen most frequent symbols and the second four bits do not include an encoded symbol; the first four bits include a short symbol from the sixteen most frequent symbols and the second four bits include a short symbol from the sixteen most frequent symbols; or the first four bits include a short symbol from the sixteen most frequent symbols and the second four bits include a short symbol from the second sixteen most frequent symbols. In this example, when a symbol from the second sixteen most frequent does not follow a symbol from the first sixteen most frequent symbols, the symbol can be encoded as a long symbol instead.

In some examples, the above-described additive coding technique achieved an 85% average compression rate for some data sets.

Figure 4:
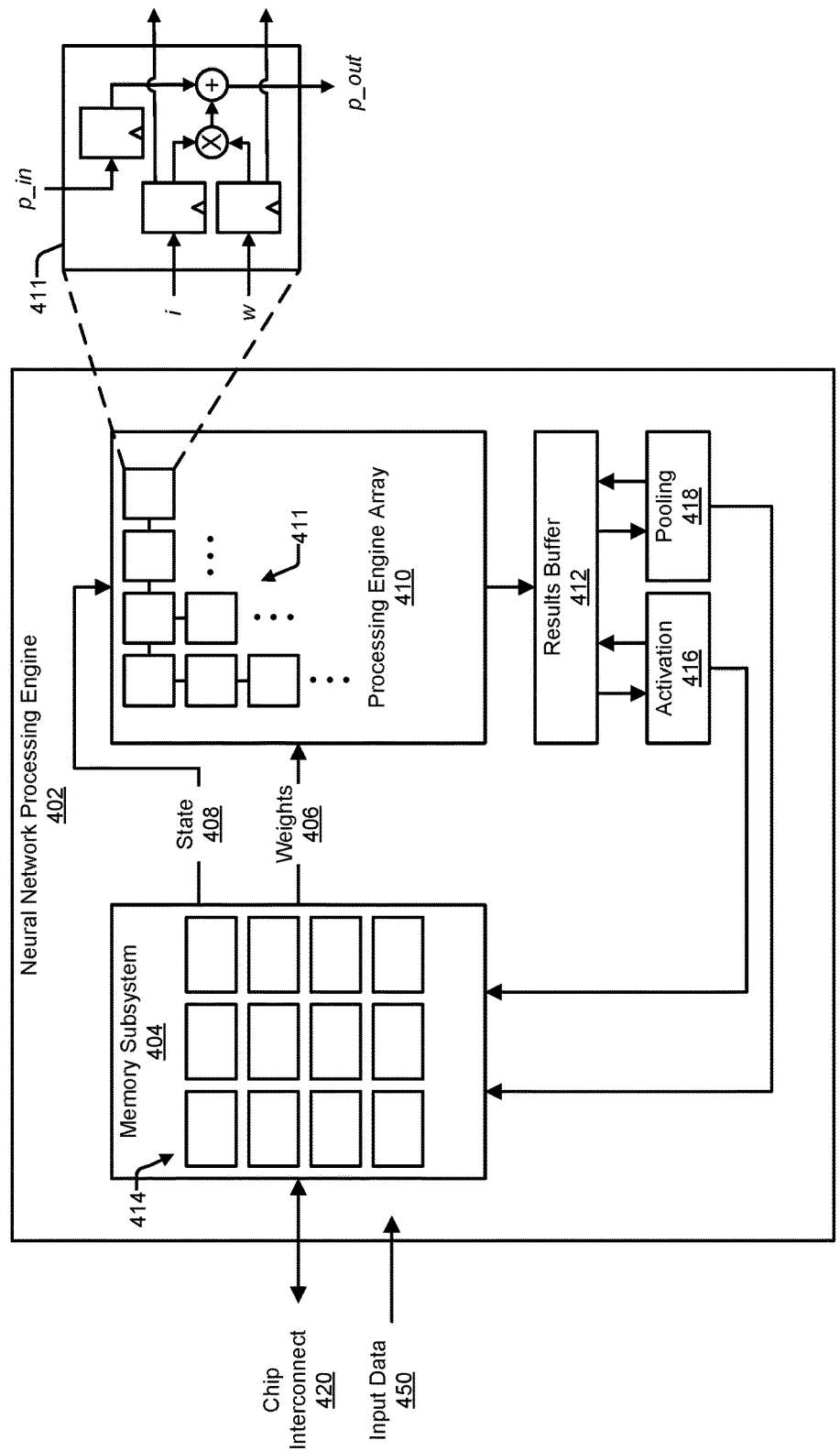
FIG. 4 includes a block diagram that illustrates an example of a neural network processing engine.

FIG. 4 includes a block diagram that illustrates an example of a neural network processing engine 402 of a neural network processor. In various implementations, the neural network processing engine 402, for a set of input data, can execute a neural network to perform a task the neural network was trained for (e.g., conduct inference). In various implementations, the example neural network processing engine 402 is an integrated circuit component of a neural network processor. The neural network processor can have other integrated circuit components, including additional neural network processing engines.

The neural network processing engine 402 illustrated in FIG. 4 is an example where a decompression circuit can be used. As discussed further below, the neural network processing engine 402 can receive data that is compressed, and can decode the compressed data before using the data.

In various implementations, the neural network processing engine 402 can include a memory subsystem 404 and a processing engine array 410. When in operation (e.g., when computing a result for a set of input data 450), the processing engine array 410 can read weight 406 and state 408 values from the memory subsystem 404. The processing engine array 410 can output computation results to a results buffer 412. In some cases, the example neural network processing engine 402 can perform an activation function (using an activation 416 block) and/or pooling (using a pooling 418 block) on the results from the processing engine array 410, before the results are written to the memory subsystem 404.

Weights 406, in this example, are the weight values for a neural network. In various implementations, the weights 406 are post-training weights, meaning that values for the weights 406 were previously determined. State 408, in this example, can include input data 450 when a computation begins, as well as intermediate values that reflect an in-progress computation. State 408, for example, can include partial sums determined by the processing engine array 410. State 408 can also include instructions for the processing engine array 410, where the instructions may be associated with a particular layer. The instructions can, for example, instruct the processing engine array 410, and possibly also the activation 416 and/or pooling 418 blocks, to execute a certain computation. The weights 406 and the state 408 can be read from the memory subsystem 404 for operating on by the processing engine array 410. In some examples, the memory subsystem can also include a separate memory or buffer for instructions.

In various implementations, the memory subsystem 404 can include multiple memory banks 414. In these implementations, each memory bank 414 can be independently accessible, meaning that the read of one memory bank is not dependent on the read of another memory bank. Similarly, writing to one memory bank does not affect or limit writing to a different memory bank. In some cases, each memory bank can be read and written at the same time. Various techniques can be used to have independently accessible memory banks 414. For example, each memory bank can have at least one read channel and may have at least one separate write channel that can be used at the same time. In these examples, the memory subsystem 404 can permit simultaneous access to the read or write channels of multiple memory banks. As another example, the memory subsystem 404 can include arbitration logic such that arbitration between, for example, the outputs of multiple memory banks 414 can result in more than one memory bank's output being used. In these and other examples, though globally managed by the memory subsystem 404, each memory bank can be operated independently of any other.

Having the memory banks 414 be independently accessible can increase the efficiency of the neural network processing engine 402. For example, weights 406 and state 408 can be simultaneously read and provided to each row of the processing engine array 410, so that the entire processing engine array 410 can be in use in one clock cycle. As another example, weights 406 and state 408 can be read at the same time that intermediate results are written to the memory subsystem 404. In contrast, a single memory, while still able to provide weights 406 and state 408 to the processing engine array 410 faster than off-chip memory, may be able to service only one read or write at a time. With a single memory, multiple clock cycles can be required, for example, to read weights for each row of the processing engine array 410 before the processing engine array 410 can be started.

In various implementations, the memory subsystem 404 can be configured to simultaneously service multiple clients, including the processing engine array 410, the activation 416 block, the pooling 418 block, and any external clients that access the memory subsystem 404 over a chip interconnect 420. In some implementations, being able to service multiple clients can mean that the memory subsystem 404 has at least as many memory banks as there are clients. In some cases, each row of the processing engine array 410 can count as a separate read client. In these cases, weights 406 and state 408 can be stored separately, and thus require two reads, or can be concatenated and stored together, thus requiring one read. In some cases, each column of the processing engine array 410 can output an intermediate value, such that each column can count as a separate write client. In some cases, output from the processing engine array 410 can be written into the memory banks 414 that can then subsequently provide input data for the processing engine array 410. The memory banks 414 can be implemented, for example, using static random access memory (SRAM).

In various implementations, the memory subsystem 404 can include control logic. The control logic can, for example, keep track of the address spaces of each of the memory banks 414, identify memory banks 414 to read from or write to, and/or move data between memory banks 414, if needed. In some implementations, the memory subsystem 404 can include multiplexors for selecting which memory bank to output to a particular client and/or to receive input from a particular client. In these implementations, the control logic can generate select signals for the multiplexors, which can enable some or all of the memory banks 414 to service each client. In some implementations, memory banks 414 can be hardwired to particular clients. For example, a set of memory banks 414 can be hardwired to provide weights 406 and state 408 to the rows of the processing engine array 410. In these examples, the control logic can move data between memory banks 414, for example, to move intermediate results from the memory banks 414 to which the intermediate results are written, to the memory banks 414 from which the intermediate results will be read for the next round of computation.

The processing engine array 410 is the computation matrix of the neural network processing engine 402. The processing engine array 410 can, for example, execute parallel integration, convolution, correlation, and/or matrix multiplication, among other things. The processing engine array 410 includes multiple processing engines 411, arranged in rows and columns, such that results output by one processing engine 411 can be input directly into another processing engine 411. Processing engines 411 that are not on the outside edges of the processing engine array 410 thus can receive data to operate on from other processing engines 411, rather than from the memory subsystem 404.

In various examples, the processing engine array 410 uses systolic execution, in which data arrives at each processing engine 411 from different directions at regular intervals. In some examples, input data can flow into the processing engine array 410 from the left and weight values can be loaded at the top. In some examples weights and input data can flow from the left and partial sums can flow from top to bottom. In these and other examples, a multiply-and-accumulate operation moves through the processing engine array 410 as a diagonal wave front, with data moving to the right and down across the array. Control signals can be input at the left at the same time as weights 406, and can flow across and down along with the computation.

In various implementations, the number of columns in the processing engine array 410 determines the computational capacity of the processing engine array 410, and the number of rows determines the required memory bandwidth for achieving maximum utilization of the processing engine array 410. The processing engine array 410 can have, for example, 64 columns and 256 rows, or some other number of columns and rows.

An example of a processing engine 411 is illustrated in FIG. 4 in an inset diagram. As illustrated by this example, a processing engine 411 can include a multiplier-accumulator circuit. Inputs from the left can include, for example, input data i and a weight value w, where the input data is a value taken from either a set of input data or a set of intermediate results, and the weight value is from a set of weight values that connect one layer of the neural network to the next. A set of input data can be, for example, an image being submitted for identification or object recognition, an audio clip being provided for speech recognition, a string of text for natural language processing or machine translation, or the current state of a game requiring analysis to determine a next move, among other things. In some examples, the input data and the weight value are output to the right, for input to the next processing engine 411.

In the illustrated example, an input from above can include a partial sum, p_in, provided either from another processing engine 411 or from a previous round of computation by the processing engine array 410. When starting a computation for a new set of input data, the top row of the processing engine array 410 can receive a fixed value for p_in, such as zero. As illustrated by this example, i and w are multiplied together and the result is summed with p_in to produce a new partial sum, p_out, which can be input into another processing engine 411. Various other implementations of the processing engine 411 are possible.

Outputs from the last row in the processing engine array 410 can be temporarily stored in the results buffer 412. The results can be intermediate results, which can be written to the memory banks 414 to be provided to the processing engine array 410 for additional computation. Alternatively, the results can be final results, which, once written to the memory banks 414 can be read from the memory subsystem 404 over the chip interconnect 420, to be output by the system.

In some implementations, the neural network processing engine 402 includes an activation 416 block. In these implementations, the activation 416 block can combine the results from the processing engine array 410 into one or more output activations. For example, for a convolutional neural network, convolutions from multiple channels can be summed to produce an output activation for a single channel. In other examples, accumulating results from one or more columns in the processing engine array 410 may be needed to produce an output activation for a single node in the neural network. In some examples, activation 416 block can be bypassed.

In some implementations, the neural network processing engine 402 can include a pooling 418 block. Pooling is the combining of outputs of a cluster of nodes from a layer of a neural network. The combined output can be provided to the next layer. Combining can include for example, computing a maximum value, a minimum value, an average value, a median value, or some other value determined from the outputs of the cluster of nodes. In various examples, the pooling 418 can be selectively activated, as needed for any particular neural network.

Input data 450 can arrive over the chip interconnect 420. The chip interconnect 420 can connect the neural network processing engine 402 to other components of a neural network processor, such as a Direct Memory Access (DMA) engine that can obtain input data 450 from an Input/Output (I/O) device, a storage drive, or a network interface. The input data 450 can be, for example one-dimensional data, such as a character string or numerical sequence, or two-dimensional data, such as an array of pixel values for an image or frequency and amplitude values over time for an audio signal. In some examples, the input data 450 can be three-dimensional, as may be the case with, for example, the situational information used by a self-driving car. In some implementations, the memory subsystem 404 can include a separate buffer for the input data 450. In some implementations, the input data 450 can be stored in the memory banks 414 along with the weights 406.

In various implementations, the weights 406 stored in the memory subsystem 404 can have been determined by training the neural network to perform one or more tasks. The input data 450 can include an instruction indicating the task to perform (e.g., image processing, speech recognition, machine translation, etc.). In various implementations, the neural network processing engine 402 is configured for conducting inference (e.g., performing a task), rather than for training of the neural network. In some implementations, the neural network processing engine 402 can be used for training, though perhaps with assistance from software to update the stored weights 406.

In various implementations, the memory subsystem 404 can include enough memory to store both intermediate results and all of the weight values for a neural network. The memory subsystem 404 should have, at a minimum, enough memory in the memory subsystem 404 to store intermediate results, but in many cases the memory subsystem 404 can include many more memory banks 414 than are needed to store just intermediate results. This additional space can be used to store some or all of the weight values for a neural network before the neural network processing engine 402 is instructed to perform inference. For example, a neural network may have 1.5 million weights, which, when each is represented by 32 bits, can require about 6 MB of memory. Intermediate results can require, for example, 10 MB of storage space, at most. On-chip memory of 20 MB is a reasonable size, and, in the preceding example, can readily accommodate the weight values, intermediate results, and any other data that the neural network processing engine 402 can need during operation.

In some examples, some or all of the weights for a neural network can be loaded into the memory subsystem 404 before the neural network processing engine 402 begins operating on a set of input data 450. In some cases, weights can continue to be loaded during the computation of a result for the set of input data 450. In these examples, the weights and other data for a neural network (such as instructions for the processing engine array 410) can be stored in an external memory (e.g., a memory outside of the neural network processing engine 402) in a compressed format. Compressing the data for the neural network can reduce the amount of memory space needed to store the neural network. Additionally, less time may be needed to read the data for the neural network into the neural network processing engine 402.

In some examples, the data for the neural network may arrive at the neural network processing engine 402 compressed, and the neural network processing engine 402 would need to decode the data so that the neural network processing engine 402 can use the data. In some implementations, the neural network processing engine 402 can thus include a decompression circuit. In these implementations, compressed data for the neural network can be received at the decompression circuit, which can decode the data and store the decoded data in the memory subsystem 404. The data can then be ready to be input in to the entire processing engine array 410.

To best take advantage of the reduced size of the compressed data, the decompression circuit in the neural network processing engine 402 should add little to no time to the time required for the data to be read from external memory. For example, if compressing the data means that the data can be transferred from the external memory to the neural network processing engine 402 25% faster than when the data is not compressed, then the decompression circuit should not add a 25% delay before the uncompressed data is available in the memory subsystem 404. A delay of even 10% may mean that the gain in the transfer speed is not worth the effort to compress the data and to include a decompression circuit in the neural network processing engine 402. As discussed above, however, in some examples, the decompression circuit may be efficient enough to add only one clock cycle of delay, which is negligible.

Figure 5:
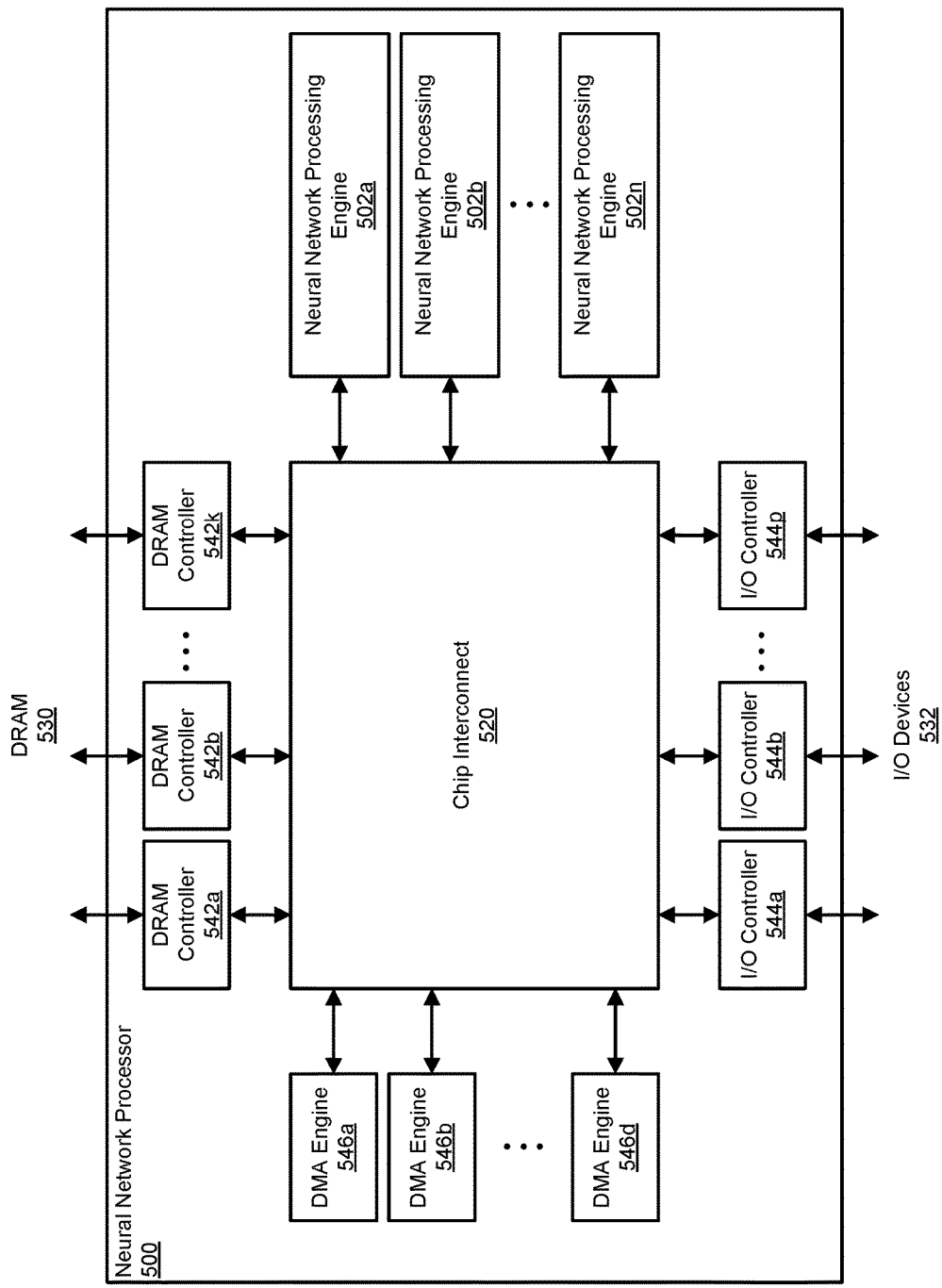
FIG. 5 includes a block diagram that illustrates an example of a neural network processor that has multiple neural network processing engines.

In various implementations, the neural network processing engine discussed above can be part of a neural network processor. FIG. 5 includes a block diagram that illustrates an example of a neural network processor 500 that has multiple neural network processing engines 502a-502n. Each of the neural network processing engines 502a-502n can include a memory subsystem and processing engine array, and can execute the computation required for a neural network to perform a task for which the neural network was programmed. In the illustrated example, the neural network processor 500 includes n neural network processing engines 502a-502n.

The example neural network processor 500 further includes DRAM controllers 542a-542k for communicating with processor memory, implemented in this example using DRAM 530. In the illustrated example, the neural network processor 500 includes k DRAM controllers 542a-542k, each of which may be able to communicate with an independent set of banks of DRAM. In other examples, other types of RAM technology can be used for the processor memory. The DRAM controllers 542a-542k can also be referred to as memory controllers.

In various examples, data for one or more neural networks can be stored in the DRAM 530. The neural networks can include different neural networks optimized for different tasks. For example, one neural network can be optimized for speech recognition, another for machine translation, and another for image recognition. In these and other examples, the neural network processor 500 can move or copy the data for the appropriate neural network from the DRAM 530 to a neural network processor, and can then instruct the neural network processor to execute the neural network. In some examples, the neural network processor 500 can be configured to preload neural networks on the neural network processors. That is, some or all of the weights for different neural networks can be loaded onto different neural network processing engines 502a-502n before any input data is received, so that the neural network processing engines 502a-502n are ready to execute a respective neural network as soon as the neural network processor 500 receives input data.

In some examples, the data for the neural networks can be stored in the DRAM 530 in a compressed format. In these examples, the neural network processing engines 502a-502n can each include decompression circuits for decoding the compressed data when the compressed data is received by the neural network processing engines 502a-502n. In some examples, the neural network processor 500 can include one decompression circuit that decodes the data for all of the neural network processing engines 502a-502n. In some examples, the DRAM controllers 542a-542k and/or the I/O controllers 544a-544p can include decompression circuits.

The example neural network processor 500 includes I/O controllers 544a-544p for communicating with I/O devices 532 in the system. The neural network processor 500 can communicate with I/O devices over, for example, a processor bus. In some examples, the processor bus can be implemented using Peripheral Component Interconnect (PCI) and/or a variation of the PCI bus protocol. The processor bus can connect the neural network processor 500 to I/O devices 532 such as, for example, input and output devices, memory controllers, storage devices, and/or network interface cards, among other things. In some examples, the I/O controllers 544-544p can enable the neural network processor 500 to act as an I/O device for a host processor. In the illustrated example, the neural network processor 500 includes p I/O controllers 544a-544p, each of which may include a separate root complex and may communicate with a separate set of I/O devices 532. In other examples, other standardized bus protocols, such as Ultra Path Interconnect (UPI) can be used for the host bus. In other examples, a proprietary bus protocol can be used.

The example neural network processor 500 further includes DMA engines 546a-546d that can move data between the neural network processing engines 502a-502n, DRAM controllers 542a-542k, and I/O controllers 544a-

544p. In the illustrated example, the neural network processor 500 includes d DMA engines 546a-546d. In some implementations, the DMA engines 546a-546d can be assigned to specific tasks, such as moving data from the DRAM controllers 542a-to the neural network processing engines 502a-502n, or moving data between the I/O controllers 544a-544p and the neural network processing engines 502a-502n. In some implementations, at least one DMA engine 546a-546d can be dedicated to each neural network processing engine 502a-502n. In some implementations, the DMA engines 546a-546d can be treated as a pool instead of being dedicated to a function or component, such that whenever data needs to be moved, an available DMA engine 546a-546d is engaged.

In the example neural network processor 500, the various components can communicate over a chip interconnect 520. The chip interconnect 520 primarily includes wiring for routing data between the components of the neural network processor 500. In some cases, the chip interconnect 520 can include a minimal amount of logic, such as multiplexors to control the direction of data, flip-flops for handling clock domain crossings, and timing logic.

In some examples, each of the neural network processing engines 502a-502n can simultaneously be executing a different neural network. In some examples, two or more of the neural network processing engines 502a-502n can be execute the same neural network for different inputs. In some examples, two or more of the neural network processing engines 502a-502n can be executing parts of the same neural network (e.g., parts of the same layer or different layers). In some examples, two or more of the neural network processing engines 502a-502n can sequentially execute layers of a neural network, such that inputs can be pipelined through the neural network processing engines.

Figure 6:
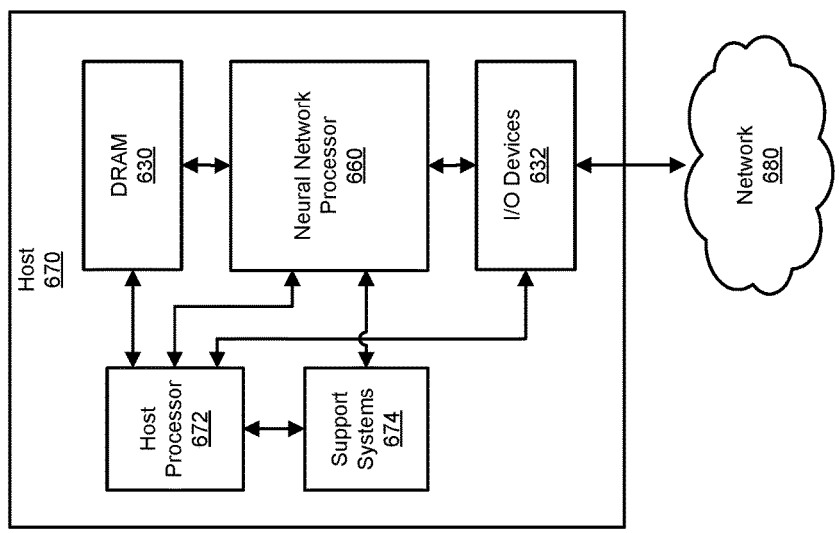
FIG. 6 includes a block diagram that illustrates an example of a host system in which a neural network processor can be used.

FIG. 6 includes a block diagram that illustrates an example of a host system 670 in which a neural network processor 660 can be used. The example host system 670 includes the neural network processor 660, a host processor 672, DRAM 630 or processor memory, I/O devices 632, and support systems 674. In various implementations, the host system 670 can include other hardware that is not illustrated here.

The host processor 672 is a general purpose integrated circuit that is capable of executing program instructions. In some examples, the host processor 672 can include multiple processing cores. In some examples, the host system 670 can include more than one host processor 672. In some examples, the host processor 672 and the neural network processor 660 can be one chip, such as, one or more integrated circuits within the same package.

In some examples, software programs executing on the host processor 672 can receive or generate input for processing by the neural network processor 660. In some examples, the programs can select an appropriate neural network to execute for a given input. For example, a program may be for language translation, and can select one or more neural networks capable of speech recognition and/or machine translation. In these and other examples, the programs can configure the neural network processor 660 with the neural network to execute, and/or can select a neural network processing engine on the neural network processor 660 that has previously been configured to execute the desired neural network. In some examples, once the neural network processor 660 has started inference on input data, the host processor 672 can manage the movement of data (such as weights, instructions, intermediate results, results of conditional layers, and/or final results) into or out of the neural network processor 660.

In some examples, a software program that is using the neural network processor 660 to conduct inference can read the result from a conditional layer from the neural network processor 660 and/or from a storage location, such as in DRAM 630. In these examples, the program can determine what action the neural network should take next. For example, the program can determine to terminate the inference. As another example, the program can determine to change the direction of the inference, which can be translated by lower level code and/or the neural network processor to a next layer to execute. In these and other examples, the execution flow of the neural network can be coordinate by software.

The DRAM 630 is memory that is used by the host processor 672 for storage of program code that the host processor 672 is in the process of executing, as well as values that are being operated on. In some examples, the data for a neural network (e.g., weight values, instructions, and other data) can be all or partially stored in the DRAM 630. DRAM is a common term for processor memory, and though DRAM is volatile memory, processor memory can be volatile and/or non-volatile.

The I/O devices 632 can include hardware for connecting to user input and output devices, such as keyboards, monitors, and printers, among other devices The I/O devices 632 can also include storage drives and/or network interfaces for connecting to a network 680.

In various implementations, the support systems 674 can include hardware for coordinating the operations of the neural network processor 660. For example, the support systems 674 can include a microprocessor that coordinates the activities of the neural network processor 660, including moving data around on the neural network processor 660. In this example, the microprocessor can be an integrated circuit that can execute microcode. Microcode is program code that can enable an integrated circuit to have some flexibility in the operations that the integrated circuit can execute, but because the program code uses a limited instruction set, the microprocessor may have much more limited capabilities than the host processor 672. In some examples, the program executed by the microprocessor is stored on the hardware of microprocessor, or on a non-volatile memory chip in the host system 670. In some examples, the microprocessor and the neural network processor 660 can be on chip, such as one integrated circuit on the same die and in the same package.

In some examples, the support systems 674 can be responsible for taking instructions from the host processor 672 when programs executing on the host processor 672 request the execution of a neural network. For example, the host processor 672 can provide the support systems 674 with a set of input data and a task that is to be performed on the set of input data. In this example, the support systems 674 can identify a neural network that can perform the task, and can program the neural network processor 660 to execute the neural network on the set of input data. In some examples, the support systems 674 only needs to select an appropriate neural network processing engine of the neural network processor. In some examples, the support systems 674 may need to load the data for the neural network onto the neural network processor 660 before the neural network processor 660 can start executing the neural network. In these and other examples, the support systems 674 can further receive the output of executing the neural network, and provide the output back to the host processor 672.

In some examples, the support systems 674 can further act upon the result of a conditional layer in a neural network. For example, the support systems 674 can read from a neural network processing engine the outcome of testing a condition. Based on the outcome, the support systems 674 can determine to stop the execution of the neural network (because the condition was met), or let the neural network continue executing (because the condition was not met). In some examples, the support systems 674 can select a next layer of the neural network to execute, where the outcome of the condition can indicate which layer is to be the next layer. In these examples, the support systems 674 can instruct a neural network processing engine to begin executing at the selected layer, and/or can load the weights for the selected layer in the neural network processing engine.

In some examples, the operations of the support systems 674 can be handled by the host processor 672. In these examples, the support systems 674 may not be needed and can be omitted from the host system 670.

Figure 7:
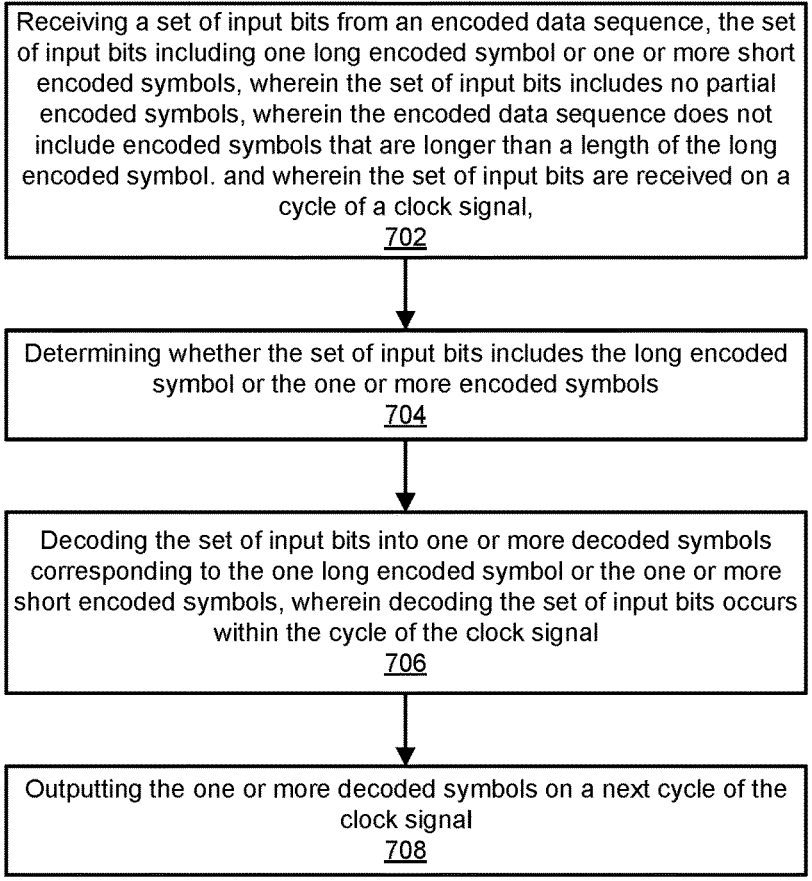
FIG. 7 illustrates an example of a process for decoding an encoded data stream.

FIG. 7 illustrates an example of a process 700 for decoding an encoded data stream. The example process 700 can be implemented by the systems described above, such as for example by an integrated circuit implementing a decompression circuit.

At step 702, the process 700 includes receiving a set of input bits from an encoded data sequence, a set of input bits from an encoded data sequence, the set of input bits including one long encoded symbol or one or more short encoded symbols, wherein the set of input bits includes no partial encoded symbols, wherein the encoded data sequence does not include encoded symbols that are longer than a length of the long encoded symbol, and wherein the set of input bits are received on a cycle of a clock signal. A partial encoded symbol occurs a sequence of bits does not include all of the bits of a symbol, and thus cannot be decoded. For example, a partial symbol would comprise fewer bits that the number of bits including in the set of input bits. In some examples, a partial encoded symbol is withheld from being decoded until bits are available to be added to the partial encoded symbol, such that the partial encoded symbol plus the additional bits are equal in length to the set of input bits.

At step 704, the process 700 includes determining whether the set of input bits includes the long encoded symbol or one or more short encoded symbols. For example, the process 700 can include, in a particular cycle of the clock signal, determining that the set of input bits includes the long symbol. As another example, the process 700 can include, in another cycle of the clock signal, that the set of input bits includes at least one short encoded symbol. In various examples, the number of symbols in the set of input bits is determined in the cycle of the clock signal in which the set of input bits is received.

In some examples, the encoded symbols are uniquely identifiable values that are each associated with a decoded symbol. In these examples, by identifying the encoded symbol, a corresponding decoded symbol can be identified.

In some examples, the encoded symbols are offsets from a base value. The base value can be associated with a particular data set, or multiple data sets. In these examples, a decoded value can be determined by adding or subtracting the offset value to or from the base value.

In some examples, the integrated circuit includes a decoder circuit that can determine whether the set of input bits includes a long encoded symbol or one or more short encoded symbols. In some examples, the set of input bits include one or more control bits indicating whether the set of input bits include a long encoded symbol or short encoded symbols. In these examples, the decoder circuit can use the control bits to determine whether the set of input bits includes a long encoded symbol or short encoded symbols.

In some examples, the set of input bits includes a control bit indicate a length of a short encoded symbol from the one or more short encoded symbols. In some examples, short encoded in the encoded data sequence can be different lengths. In some examples, the set of input bits can include short encoded symbols each having a same length, where one or more control bits indicate the length. In some examples, the set of input bits can include short encoded symbols that have different lengths. In these examples, the set of input bits can include multiple control bits for indicating the different lengths.

In some examples, a length of the short encoded symbols is such that more than one short encoded symbol can be encoded into the same number of bits used to encode a long encoded symbol. For example, the number of bits needed to represent the long symbol can be same as the number of bits needed to represent two, three, or more encoded symbols.

At step 706, the process 700 includes decoding the set of input bits one or more decoded symbols corresponding to the one long encoded symbol or the one or more short encoded symbols. In some examples, process 700 includes using a lookup table to decode the set of input bits. In these examples, the lookup table can include mappings of short encoded symbols to decoded symbols. In some examples, the process 700 includes using an adder circuit to decode the set of input bits. In these examples, a short encoded symbol can be added to (or subtracted from) a base value to determine a decoded symbol. In these and other examples, when the set of input bits includes a long encoded symbol, then the one or more decoded symbols will include one decodes symbol. Alternatively, when the set of input bits includes one or more short encodes symbols, the one or more decoded symbols will include a same number of decoded symbols are the number of encoded symbols includes in the one or more short encoded symbols.

At step 708, the process 700 includes outputting the one or more decoded symbols. In some examples, the integrated circuit includes a selector circuit that outputs the decoded symbols. In some examples, a decoder circuit of the integrated circuit provides the decoded symbols to the selector circuit. In these examples, the decoder circuit can also output an indication of whether the decoder circuit identified one long encoded symbol or one or more short encoded symbols.

In various examples, the integrated circuit outputs the one or more decoded symbols in a cycle of the clock signal following the cycle of the clock signal in which a set of input bits was received. For example, the integrated circuit can receive the set of input bits on a clock edge denoting a first cycle of the clock signal. In this example, the integrated circuit can decode the set of input bits within the first cycle of the clock signal, and can output decoded symbols on a clock edge denoting a second cycle of the clock signal, wherein the second cycle of the clock signal occurs immediately after the first cycle of the clock signal. The decoded symbols can be output, for example, by a selector circuit.

In various examples, the encoded data sequence encodes a data set. In these examples, symbols in the data set having a frequency of appearing in the data set, and the symbols in the data set can be encoded as long encoded symbols or short encoded symbols based on how frequently the symbols appear in the data set. For example, a subset of symbols that appear the most frequently (e.g., the eight, sixteen, thirty-two, most frequent, or some other number of the most frequent) can be encoded as short symbols while the remaining symbols can be encoded as long symbols.

Figure 8:
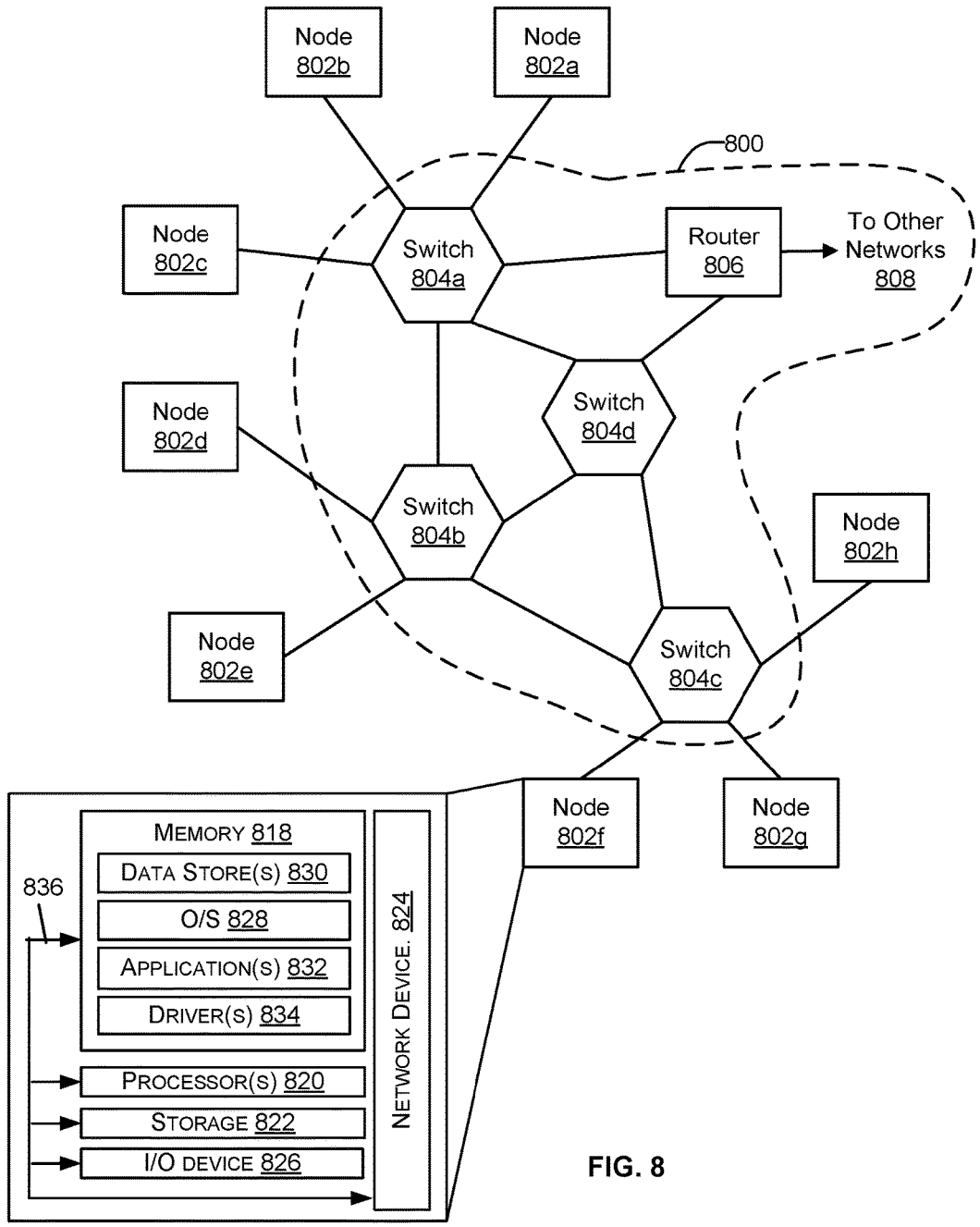
FIG. 8 illustrates an example architecture for features and systems described herein that includes one or more service provider computers and/or a user device connected via one or more networks, according to certain aspects of the disclosure.

FIG. 8 illustrates a network 800, illustrating various different types of network devices such as nodes comprising the network device, switches and routers. In certain embodiments, the network 800 may be based on a switched architecture with point-to-point links. As illustrated in FIG. 8, the network 800 includes a plurality of switches 804a-804d, which may be arranged in a network. In some cases, the switches are arranged in a multi-layered network, such as a Clos network. A network device that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 804a-804d may be connected to a plurality of nodes 802a-802h and provide multiple paths between any two nodes.

The network 800 may also include one or more network devices for connection with other networks 808, such as other subnets, LANs, wide area networks (WANs), or the Internet, and may be referred to as routers 806. Routers use headers and forwarding tables to determine the best path for forwarding the packets, and use protocols such as internet control message protocol (ICMP) to communicate with each other and configure the best route between any two devices.

In some examples, network(s) 800 may include any one or a combination of many different types of networks, such as cable networks, the Internet, wireless networks, cellular networks and other private and/or public networks. Interconnected switches 804a-804d and router 806, if present, may be referred to as a switch fabric, a fabric, a network fabric, or simply a network. In the context of a computer network, terms "fabric" and "network" may be used interchangeably herein.

Nodes 802a-802h may be any combination of host systems, processor nodes, storage subsystems, and I/O chassis that represent user devices, service provider computers or third party computers.

User devices may include computing devices to access an application 832 (e.g., a web browser or mobile device application). In some aspects, the application 832 may be hosted, managed, and/or provided by a computing resources service or service provider. The application 832 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 808. Additionally, the user device(s) may be part of the distributed system managed by, controlled by, or otherwise part of the service provider computer(s) (e.g., a console device integrated with the service provider computers).

The node(s) of FIG. 8 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 832 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 802a-802h may include at least one memory 818 and one or more processing units (or processor(s) 820). The processor(s) 820 may be implemented in hardware, computer-executable instructions, firmware, or combinations thereof. Computer-executable instruction or firmware implementations of the processor(s) 820 may include computer-executable or machine-executable instructions written in any suitable programming language to perform the various functions described.

In some instances, the hardware processor(s) 820 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 818 may store program instructions that are loadable and executable on the processor(s) 820, as well as data generated during the execution of these programs. Depending on the configuration and type of the node(s) 802a-802h, the memory 818 may be volatile (such as RAM) and/or non-volatile (such as ROM, flash memory, etc.). The memory 818 may include an operating system 828, one or more data stores 830, one or more application programs 832, one or more drivers 834, and/or services for implementing the features disclosed herein.

The operating system 828 may support nodes 802a-802h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 828 may also be a proprietary operating system.

The data stores 830 may include permanent or transitory data used and/or operated on by the operating system 828, application programs 832, or drivers 834. Examples of such data include web pages, video data, audio data, images, user data, and so on. The information in the data stores 830 may, in some implementations, be provided over the network(s) 808 to user devices. In some cases, the data stores 830 may additionally or alternatively include stored application programs and/or drivers. Alternatively or additionally, the data stores 830 may store standard and/or proprietary software libraries, and/or standard and/or proprietary application user interface (API) libraries. Information stored in the data stores 830 may be machine-readable object code, source code, interpreted code, or intermediate code.

The drivers 834 include programs that may provide communication between components in a node. For example, some drivers 834 may provide communication between the operating system 828 and additional storage 822, network device 824, and/or I/O device 826. Alternatively or additionally, some drivers 834 may provide communication between application programs 832 and the operating system 828, and/or application programs 832 and peripheral devices accessible to the service provider computer. In many cases, the drivers 834 may include drivers that provide well-understood functionality (e.g., printer drivers, display drivers, hard disk drivers, Solid State Device drivers). In other cases, the drivers 834 may provide proprietary or specialized functionality.

The service provider computer(s) or servers may also include additional storage 822, which may include removable storage and/or non-removable storage. The additional storage 822 may include magnetic storage, optical disks, solid state disks, flash memory, and/or tape storage. The additional storage 822 may be housed in the same chassis as the node(s) 802a-802h or may be in an external enclosure. The memory 818 and/or additional storage 822 and their associated computer-readable media may provide non-volatile storage of computer-readable instructions, data structures, program modules, and other data for the computing devices. In some implementations, the memory 818 may include multiple different types of memory, such as SRAM, DRAM, or ROM.

The memory 818 and the additional storage 822, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 818 and the additional storage 822 are examples of computer storage media. Additional types of computer storage media that may be present in the node(s) 802a-802h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 802a-802h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 802a-802h may also include I/O device(s) 826, such as a keyboard, a mouse, a pen, a voice input device, a touch input device, a display, speakers, a printer, and the like. The node(s) 802a-802h may also include one or more communication channels 836. A communication channel 836 may provide a medium over which the various components of the node(s) 802a-802h can communicate. The communication channel or channels 836 may take the form of a bus, a ring, a switching fabric, or a network.

The node(s) 802a-802h may also contain network device(s) 824 that allow the node(s) 802a-802h to communicate with a stored database, another computing device or server, user terminals and/or other devices on the network(s) 800.

In some implementations, the network device 824 is a peripheral device, such as a PCI-based device. In these implementations, the network device 824 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, a bus interface module may implement NVMe, and the network device 824 may be connected to a computing system using a PCIe interface.

A PCI-based device may include one or more functions. A "function" describes operations that may be provided by the network device 824. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 824 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 8, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit for decoding an encoded data sequence, comprising:
    a first decoder circuit;
    a second decoder circuit; and
    a selector circuit;
    wherein the integrated circuit is operable to, on a cycle of a clock signal:
        receive input bits from the encoded data sequence;
        input a first subset of bits from the input bits into the first decoder circuit;
        input a second subset of bits from the input bits into the second decoder circuit, wherein the first subset of bits and the second subset of bits are equal in length, and wherein the first subset of bits and the second subset of bits are non-overlapping;
    wherein, during the cycle of the clock signal, the first decoder circuit is operable to:
        determine that the first subset of bits includes a long encoded symbol; and
        decode the long encoded symbol into a first decoded symbol;
    wherein, during the cycle of the clock signal, the second decoder circuit is operable to:
        determine that the second subset of bits includes one or more short encoded symbols; and
        decode the one or more short encoded symbols into one or more decoded symbols;
    and wherein, on a next cycle of the clock signal, the selector circuit is operable to:
        output the first decoded symbol and the one or more decoded symbols.

2. The integrated circuit of claim 1, wherein the long encoded symbol includes a first number of bits, and the encoded data sequence does not include encoded symbols that are longer than the first number of bits.

3. The integrated circuit of claim 1, wherein the one or more short encoded symbols have a second number of bits, and wherein the second number of bits enables more than one short encoded symbol to be included in the second subset of bits.

4. The integrated circuit of claim 1, wherein a number of the one or more decoded symbols is a same number as a number of the one or more short encoded symbols.

5. The integrated circuit of claim 1, wherein the one or more short encoded symbols each include a uniquely identifiable value associated with an unencoded symbol.

6. The integrated circuit of claim 5, wherein the second decoder circuit includes a lookup table including a mapping of short encoded symbols to decoded symbols, and wherein the second decoder circuit is operable to use the lookup table to decode the one or more short encoded symbols.

7. The integrated circuit of claim 1, wherein the one or more short encoded symbols each include an offset from a base value.

8. The integrated circuit of claim 7, wherein the second decoder circuit includes an adder circuit, and wherein the second decoder circuit is operable to use the adder circuit to add a short encoded symbol from the one or more short encoded symbols to the base value to decode the short encoded symbol into a decoded symbol.

9. An integrated circuit, comprising:
a decoder circuit; and
a selector circuit coupled to the decoder circuit;
wherein the integrated circuit is operable to, at a first edge of a clock signal:
receive a set of input bits from an encoded data sequence, the set of input bits including one long encoded symbol or one or more short encoded symbols, wherein the set of input bits includes no partial encoded symbols, and wherein the encoded data sequence does not include encoded symbols that are longer than a length of the long encoded symbol;
determine, using the decoder circuit, whether the set of input bits includes the one long encoded symbol or the one or more short encoded symbols;
decode, using the decoder circuit, the set of input bits into one or more decoded symbols corresponding to the one long encoded symbol or the one or more short encoded symbols; and
output, using the selector circuit, the one or more decoded symbols.

10. The integrated circuit of claim 9, wherein the set of input bits include a control bit indicating whether the set of input bits include the long encoded symbol or the one or more short encoded symbols.

11. The integrated circuit of claim 9, wherein the set of input bits include a control bit indicating a length of a short encoded symbol from the one or more short encoded symbols.

12. The integrated circuit of claim 9, wherein the decoder circuit is operable to output to the selector circuit an indication of whether the set of inputs bits includes the one long encoded symbol or the one or more short encoded symbols.

13. The integrated circuit of claim 9, wherein the selector circuit is operable to output the one or more decoded symbols at a second edge of the clock signal, wherein the second edge of the clock signal occurs at a cycle of the clock signal immediately following a cycle of the clock signal at which the first edge of the clock signal occurs.

14. The integrated circuit of claim 9, wherein, in a particular cycle of the clock signal, the integrated circuit is operable to determine, using the decoder circuit, that the set of input bits includes the long encoded symbol.

15. The integrated circuit of claim 9, wherein, in a particular cycle of the clock signal, the integrated circuit is operable to determine, using the decoder circuit, that the set of input bits includes a short encoded symbol.

16. The integrated circuit of claim 9, wherein the encoded data sequence encodes a data set, symbols in the data set having a frequency of appearing in the data set, and wherein the symbols in the data set are encoded as long encoded symbols or short encoded symbols based on how frequently the symbols appear in the data set.

17. The integrated circuit of claim 9, wherein the decoder circuit includes a lookup table, and wherein the decoder circuit is operable to use the lookup table to decode the set of input bits.

18. The integrated circuit of claim 9, wherein the decoder circuit includes an adder circuit, and wherein the decoder circuit is operable to use the adder circuit to decode the set of input bits.

19. A computer-implemented method, comprising:
receiving, at an integrated circuit, a set of input bits from an encoded data sequence, the set of input bits including one long encoded symbol or one or more short encoded symbols, wherein the set of input bits includes no partial encoded symbols, wherein the encoded data sequence does not include encoded symbols that are longer than a length of the long encoded symbol, and wherein the set of input bits are received on a cycle of a clock signal;
determining whether the set of input bits includes the long encoded symbol or the one or more short encoded symbols;
decoding the set of input bits into one or more decoded symbols corresponding to the one long encoded symbol or the one or more short encoded symbols, wherein decoding the set of input bits occurs within the cycle of the clock signal; and
outputting the one or more decoded symbols on a next cycle of the clock signal.

20. The computer-implemented method of claim 19, wherein, when the set of input bits includes the long encoded symbol, the one or more decoded symbols includes one decoded symbol.

21. The computer-implemented method of claim 19, wherein, when the set of input bits includes the one or more short encoded symbols, the one or more decoded symbols includes a same number of decoded symbols as there are encoded symbols in the one or more short encoded symbols.

* * * * *